United States Patent
Kohiyama et al.

(10) Patent No.: US 6,175,385 B1
(45) Date of Patent: *Jan. 16, 2001

(54) DIGITAL PLL CIRCUIT FOR MPED STREAM AND MPEG DECODER HAVING THE DIGITAL PLL CIRCUIT

(75) Inventors: Kiyoshi Kohiyama; Hideaki Shirai; Takahiko Tahira, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/951,459

(22) Filed: Oct. 16, 1997

(30) Foreign Application Priority Data

Jun. 20, 1997 (JP) .................................. 9-164239

(51) Int. Cl.$^7$ ...................................................... H03L 7/00
(52) U.S. Cl. ........................ 348/537; 348/549; 348/845.3
(58) Field of Search .................................. 348/536, 537, 348/518–520, 549, 845.3; 331/20

(56) References Cited

U.S. PATENT DOCUMENTS

| | | | |
|---|---|---|---|
| 5,565,923 | * 10/1996 | Zdepski | 348/845.3 |
| 5,808,691 | * 9/1998 | Malcolm, Jr. et al. | 348/549 |
| 5,815,214 | * 9/1998 | Williams | 348/549 |
| 5,818,539 | * 10/1998 | Naimpally et al. | 348/845.3 |
| 5,874,995 | * 2/1999 | Naimpally et al. | 348/845.3 |

\* cited by examiner

*Primary Examiner*—Victor R. Kostak
(74) *Attorney, Agent, or Firm*—Staas & Halsey LLP

(57) ABSTRACT

A digital PLL circuit employs a fixed-frequency output signal from a fixed-frequency oscillator, to provide a signal synchronized with an external reference signal. The digital PLL circuit has a counter and an adjuster. The counter counts clock periods (clock pulses) of the fixed-frequency output signal. The adjuster increments or decrements a value counted by the counter a predetermined number of times in a predetermined period according to a deviation of the fixed-frequency output signal from the reference signal. This digital PLL circuit is inexpensive because it employs no DA converter nor VCO.

36 Claims, 22 Drawing Sheets

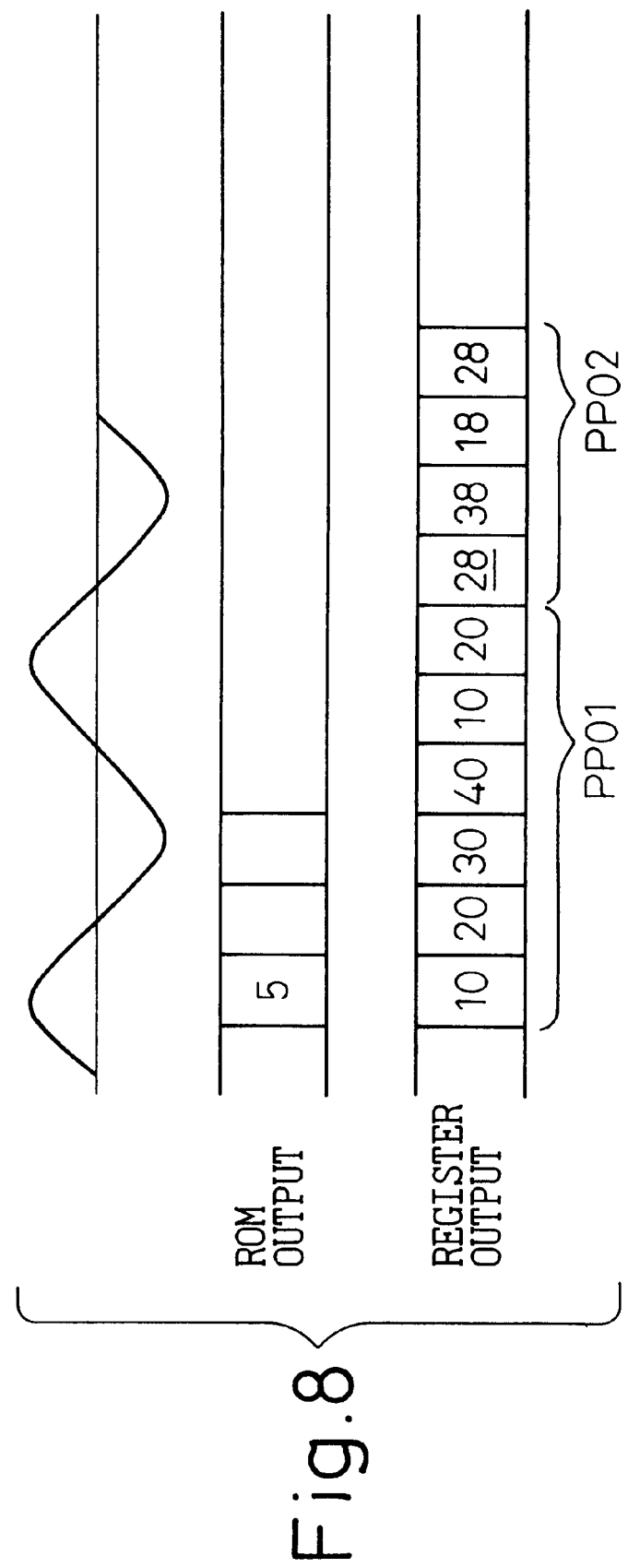

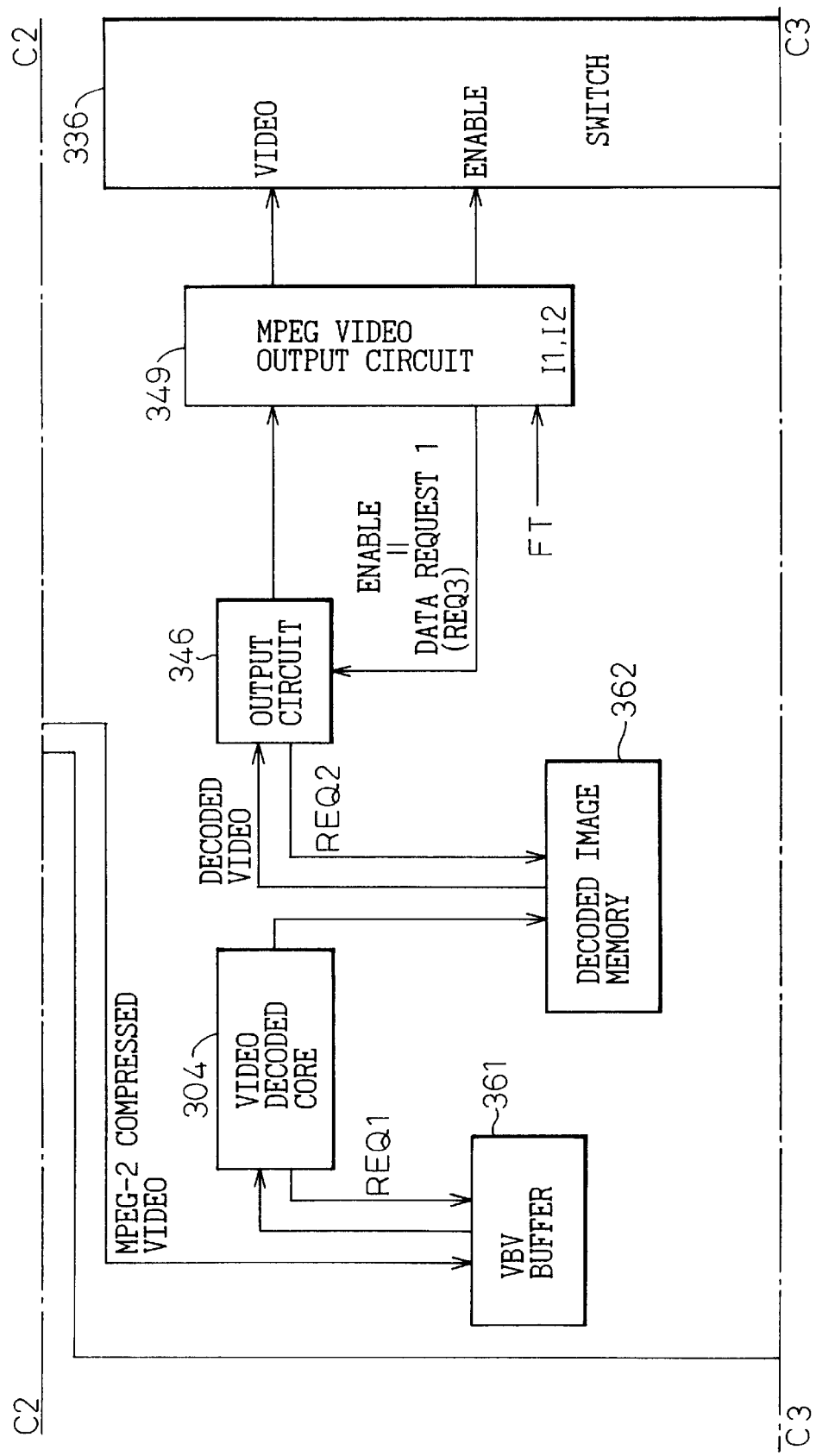

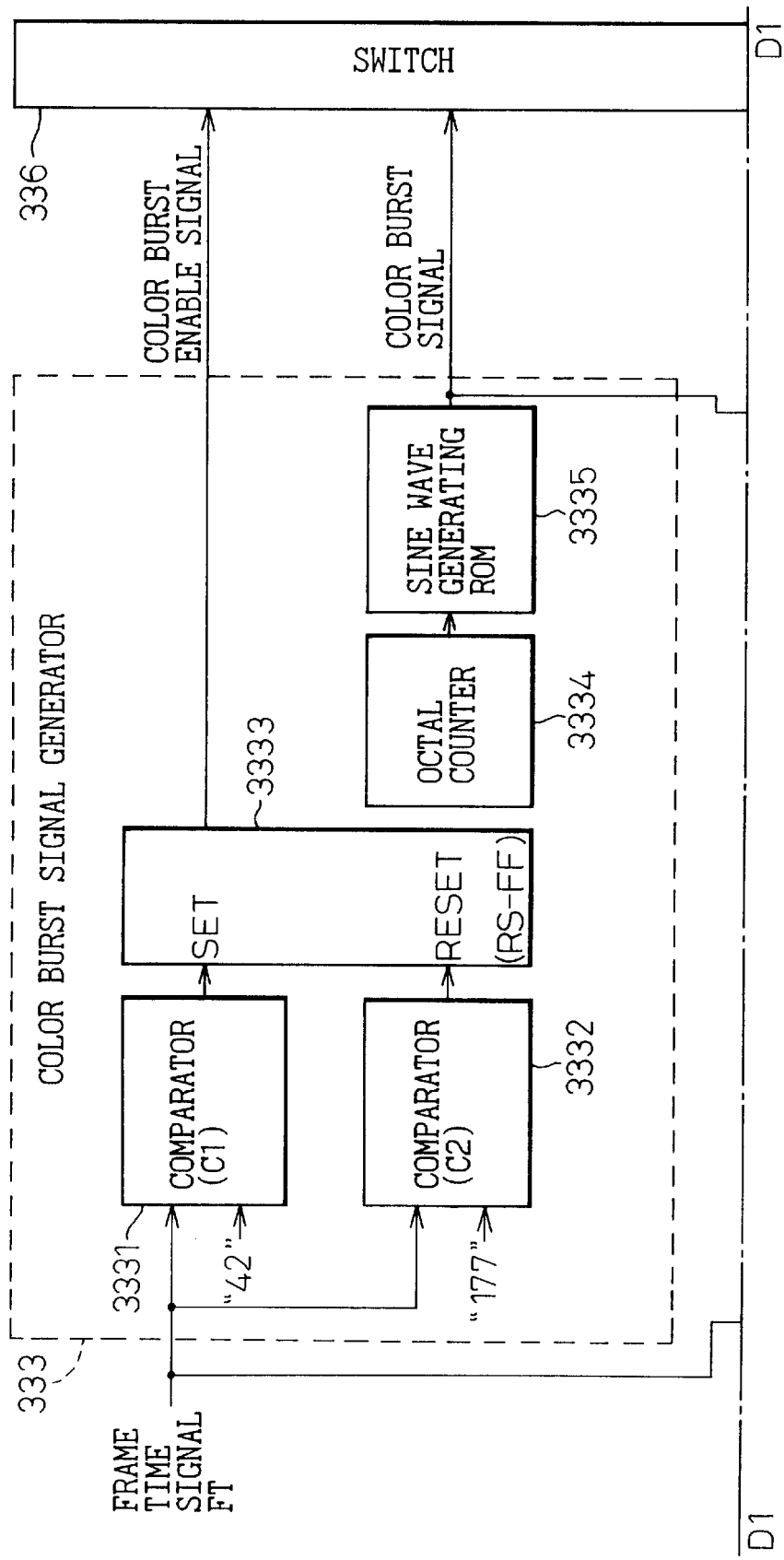

DIGITAL PLL CIRCUIT FOR MPED STREAM AND MPEG DECODER HAVING THE DIGITAL PLL CIRCUIT

BACKGROUND OF THE INVENTION

1. Field of the Invention

The present invention relates to a digital PLL (phase locked loop) circuit and an MPEG (Moving Picture Experts Group) decoder, and more particularly, to a digital PLL circuit for an MPEG stream.

2. Description of the Related Art

The techniques standardized by MPEG for compressing dynamic images are widely used. An MPEG system stream compressed according to MPEG-2:ISO-13818-1 contains audio and video streams. The audio and video streams require synchronized output timing to realize harmony in reproduced sounds and images and avoid inconveniences that a person in the screen moves his mouth without uttering a sound and that a bang occurs sometime after a door is closed on the screen.

Compressed audio and video information transmitted in an MPEG transmission stream to an MPEG decoder is temporarily stored in a memory of the decoder until it is needed to reproduce original sounds and images. The transmission stream is usually provided at a fixed speed, and therefore, the memory will be full of information if the information reproducing speed is slow. This results in abandoning part of the received information. This must be avoided. On the other hand, if the information reproducing speed is too fast, the memory will be empty to stop sounds and images being provided for the viewer. This also must be avoided. It is necessary, therefore, to adjust the information transmission and reproducing speeds to each other.

Namely, the transmitter must provide the receiver with a proper amount of information so that the memory of the receiver may cause no overflow or underflow and so that the receiver may reproduce sounds and images in harmony.

To improve a compression ratio of video information, MPEG sometimes transmits only the difference between a preceding image and a current image. In this case, the compression ratio differs depending on images. For example, a still image involves little information to be transmitted in a unit period, while a moving image involves a lot of information to be transmitted in the same period.

To transmit such video information having different compression ratios, a technique of varying transmission capacity depending on compression ratios is not popular. Instead, a fixed capacity transmission is widely employed. For example, a broadcasting system transmits a digital stream by assigning a fixed transmission band to a given channel and by employing a fixed transmission bit rate and a fixed frame rate (30 frames per second).

Since the amount of information to be transmitted differs depending on compression ratios, the difference between the fixed transmission rate and the varying information amount must be absorbed. For this purpose, the international standards specify the capacity of a receiver memory (a VBV buffer) to temporarily store compressed information transmitted at the fixed rate. A processor of the receiver reads the information out of the memory, expands the same, and displays original images according to the expanded information.

If information is transmitted at a high compression ratio, the memory accumulates more information than an amount of information read out therefrom. If the compression ratio is low, information accumulated in the memory is read out therefrom to reproduce images without deteriorating the quality of the images. The international standards specify a way of compressing video and audio data without causing an overflow or underflow in the memory.

To reproduce sounds and images in harmony without an overflow or underflow in the memory, MPEG stipulates that a transmitter must send a program clock reference (PCR) that indicates a current time, which the transmitter assumes and a presentation time stamp (PTS), which indicates a time of which the transmitter expects images and sounds to be reproduced. Namely, the transmitter sets the PCR and instructs a receiver when images and sounds, transmitted thereto must be reproduced. By simply following the instructions, the receiver is able to provide a viewer with matching sounds and images without causing an overflow or underflow in a VBV buffer of the receiver. Namely, the transmitter's responsibility to prevent an overflow or underflow in the VBV buffer of a receiver.

MPEG specifies that PCR must be sent at intervals of every 0.1 seconds or shorter and PTS at intervals of every 0.7 seconds or shorter. On the other hand, the receiver generates its own internal reference clock signal based on PCR with the use of an oscillator and a PLL circuit that controls the oscillator. The frequency of the internal clock signal must be 27 MHz. Namely, the receiver drives, for example, a video signal processor according to the 27-MHz internal clock signal that is generated based on PCR provided by the transmitter at intervals of 0.1 seconds.

A PLL circuit installed in an MPEG decoder of a receiver usually consists of a DA (digital-to-analog) converter and a VCO (voltage controlled oscillator). These DA converter and VCO are expensive components and increase the cost of the MPEG decoder.

This and other problems of the conventional PLL circuit and MPEG decoder will be explained later with reference to drawings.

SUMMARY OF THE INVENTION

An object of the present invention is to provide an inexpensive digital PLL circuit that employs no DA converter or VCO. Another object of the present invention is to provide an inexpensive MPEG decoder employing such a PLL circuit.

According to the present invention, there is provided a digital PLL circuit that employs a fixed-frequency output signal from a fixed-frequency oscillator, to provide a signal synchronized with an external reference signal, comprising a counting unit for counting clock periods of the fixed-frequency output signal and an adjusting unit for incrementing or decrementing a value counted by the counting unit a predetermined number of times in a predetermined period according to a deviation of the fixed-frequency output signal from the reference signal.

The counting unit may count clock periods of a signal whose frequency is n times the frequency of the fixed-frequency output signal, where n is a positive integer. The digital PLL circuit may be applied to an MPEG decoder, the reference signal may be a program clock reference signal in an MPEG stream, and the output signal of the digital PLL circuit may be used as a clock signal for synchronizing a stream receiver of the MPEG decoder with the program clock reference signal.

The digital PLL circuit may be used to decode and reproduce MPEG audio information. The digital PLL circuit may be used to decode and reproduce MPEG video information.

The digital PLL circuit may adjust a phase of a predetermined signal when converting the decoded MPEG video information into television signals. The decoded MPEG video information may be digitally converted into television signals by an NTSC encoder according to the reference signal or a clock signal synchronized with the reference signal, and the digital PLL circuit may reversely adjust, according to phase information, a phase of a color subcarrier used by the NTSC encoder when carrying out a conversion, the phase information being for correcting a hue error caused by an adjustment made by the adjusting unit.

The digital PLL circuit may correct a value counted by a counter that controls an overall timing of an output circuit operating on the reference signal, thereby synchronizing the counter with the reference signal. A value counted by the counter that controls the overall timing of the output circuit operating on the reference signal may be incremented or decremented once or a plurality of times by a predetermined value in a predetermined period, to change the overall timing of the output circuit and synchronize the same with the reference signal. The predetermined value and the number of increments or decrements in the predetermined period may be adjustable.

An increment or a decrement in the value counted by the counter may be carried out in one or a plurality of time bands in a blanking period after image information is displayed and before the next synchronous signal arrives. An increment or a decrement in the value counted by the counter may be carried out in a plurality of time bands distributed over fields, frames, horizontal scan periods, or a combination thereof.

Further, according to the present invention, there is also provided an MPEG decoder having a memory unit for temporarily storing an MPEG stream and a digital PLL circuit for employing a fixed-frequency output signal from a fixed-frequency oscillator to provide a signal synchronized with an external reference signal, wherein the digital PLL circuit comprises a counting unit for counting clock periods of the fixed-frequency output signal and an adjusting unit for incrementing or decrementing a value counted by the counting unit a predetermined number of times in a predetermined period according to a deviation of the fixed-frequency output signal from the reference signal.

BRIEF DESCRIPTION OF THE DRAWINGS

The present invention will be more clearly understood from the description of the preferred embodiments as set forth below with reference to the accompanying drawings, wherein:

FIG. 8 is a timing chart showing the operation of the sine wave generator of FIG. 7;

FIGS. 12A to 12D are block diagrams showing a digital PLL circuit according to a third embodiment of the present invention;

FIGS. 14A and 14B are block diagrams showing a color burst signal generator and an MPEG video output circuit both incorporated in the digital PLL circuit of FIGS. 12A to 12D.

DESCRIPTION OF THE PREFERRED EMBODIMENTS

For a better understanding of the preferred embodiments of the present invention, the problems of the prior art will be explained with reference to FIGS. 1 and 2.

Figure 1:
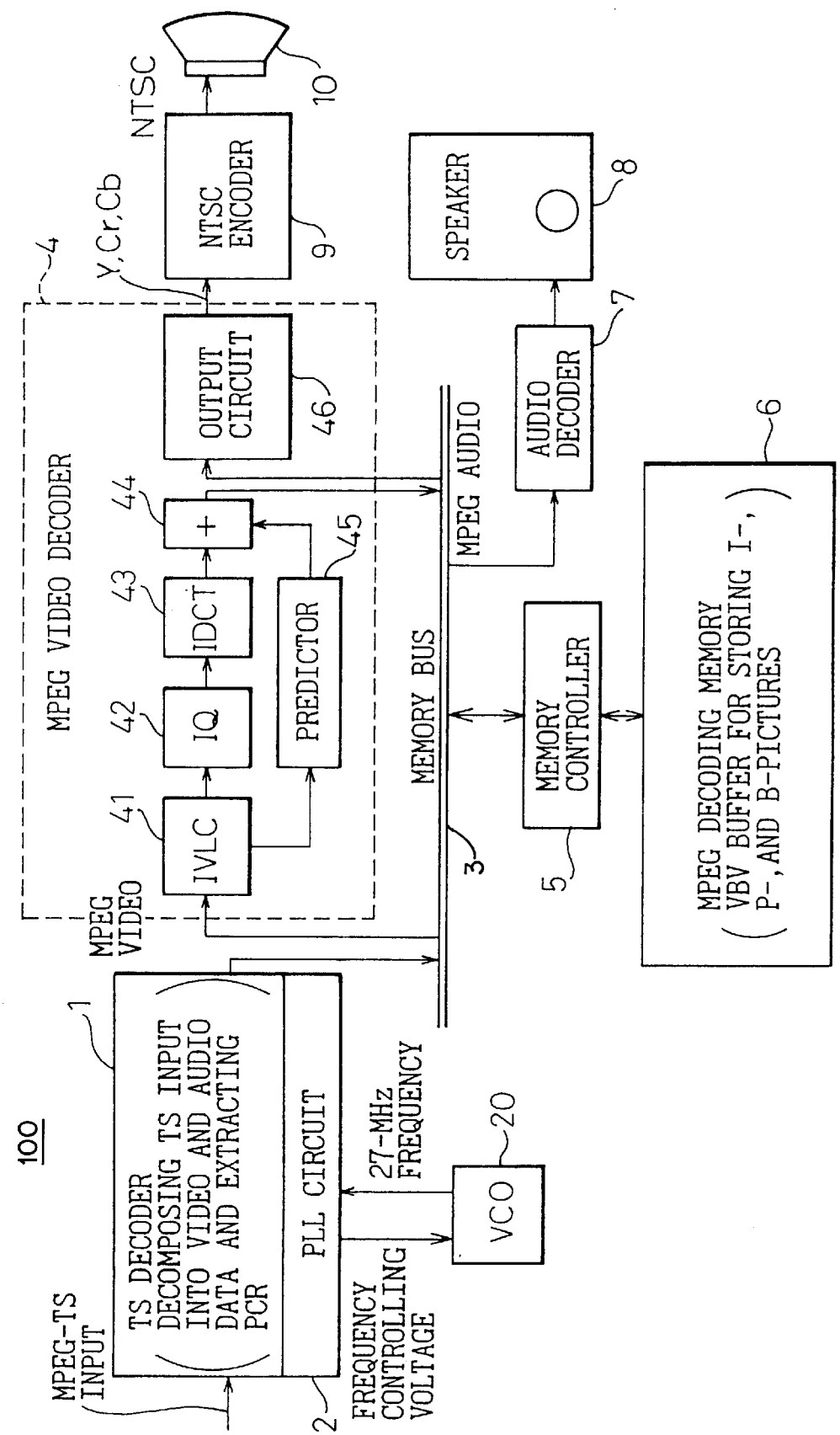
FIG. 1 is a block diagram showing an MPEG decoder according to a prior art.

FIG. 1 is a block diagram showing an MPEG decoder 100 according to the prior art. The MPEG decoder has a TS (transmission stream) decoder 1, a PLL circuit 2, a memory bus 3, an MPEG video decoder 4, a memory controller 5, an MPEG decoding memory 6, an audio decoder 7, a speaker 8, an NTSC (National Television System Committee) encoder 9, a display 10, and a VCO (voltage controlled oscillator) 20.

The TS decoder 1, MPEG video decoder 4, memory controller 5, and audio decoder 7 are connected to one another through the memory bus 3. The MPEG video decoder 4 includes an IVLC (inverse variable length coding unit) 41, an IQ (inverse quantization unit) 42, an IDCT (inverse discrete cosine transforming unit) 43, an adder 44, a predictor 45, and an output circuit 46.

The structure of the MPEG video decoder 4 of FIG. 1 is standard. The TS decoder 1 decomposes an MPEG transmission stream into I-, P-, and B-pictures. These pictures are passed through the memory bus 3 and memory controller 5 and are stored in the memory 6 serving as a VBV buffer.

The I-picture is an intra-picture compressed without referring to another picture. The P-picture is a predictive picture compressed with reference to the I-picture. Namely, the P-picture is prepared by predicting a picture temporally before the same. The B-picture is a bidirectionally predictive picture compressed with reference to the I- and P-pictures. Namely, the B-picture is prepared by predicting a picture temporally before and after the same.

The I-, P-, and B-pictures are expanded or decoded through the IVLC 41, IQ 42, IDCT 43, adder 44, and predictor 45. The decoded pictures are passed through the output circuit 46 to the NTSC encoder 9, which converts the pictures into NTSC signals to display original images on the display 10. The display 10 may be a home television set. The TS decoder 1 also separates compressed audio information from the transmission stream. The compressed audio information is, for example, 16-bit data sampled at 44.1 KHz. The audio information is decoded by the audio decoder 7 and is provided as sounds from the speaker 8. The details of the MPEG video decoder 4 and audio decoder 7 will not be explained because they are not directly related to the present invention.

Figure 2:
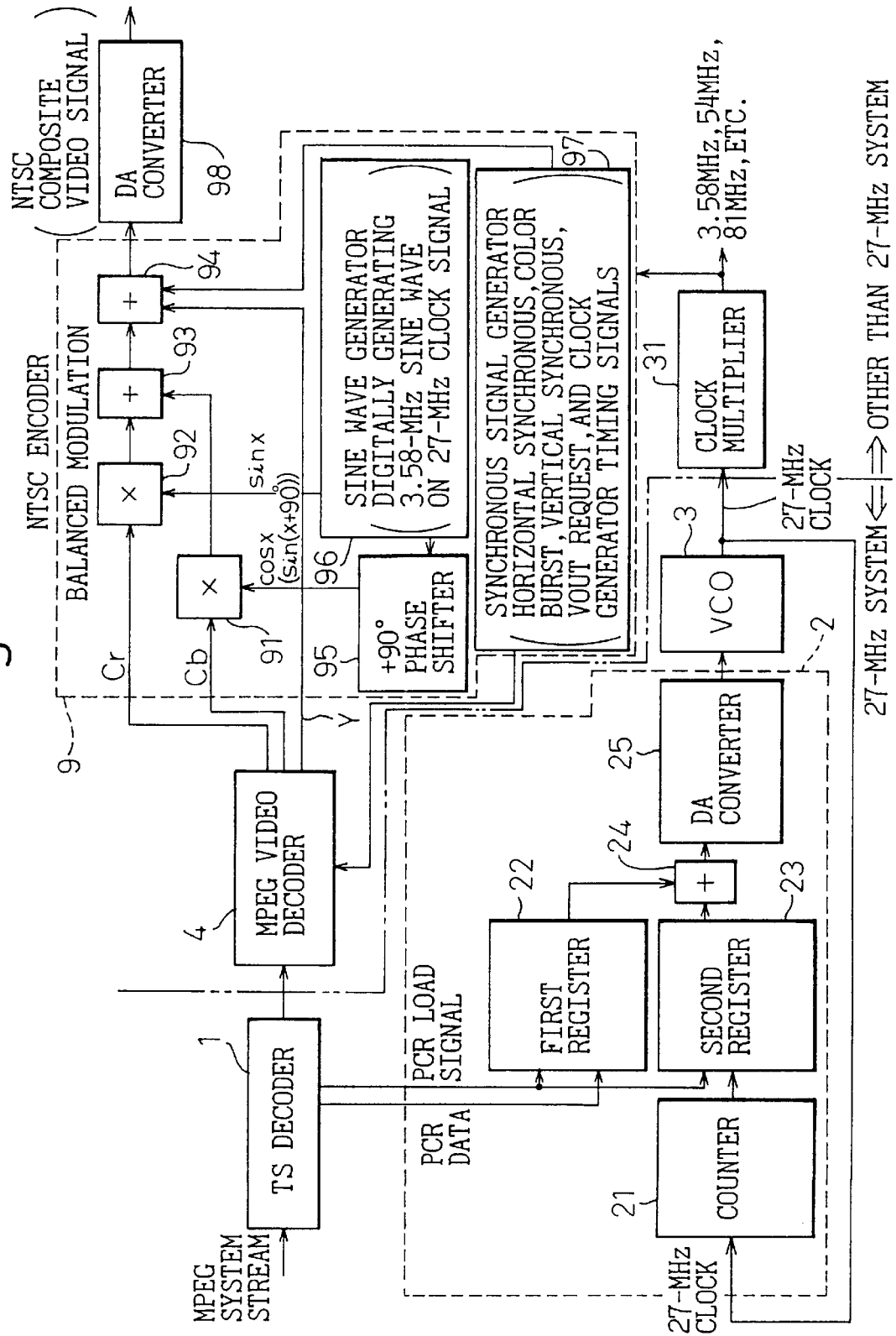
FIG. 2 is a block diagram showing a PLL circuit incorporated in the MPEG decoder of FIG. 1.

FIG. 2 is a block diagram showing the PLL circuit 2 installed in the MPEG decoder of FIG. 1.

The TS decoder 1 decodes a PCR (program clock reference) contained in the MPEG transmission stream into a PCR load signal and a PCR value. The PCR value is stored in a first register 22. At the same time, a value counted by a counter 21, which is driven based on a 27-MHz internal clock signal, is stored in a second register 23. If the internal clock signal is synchronized with a 27-MHz clock signal that prepares PCR in the transmission stream, the values stored in the registers 22 and 23 will be equal to each other, and if not, they will differ from each other.

In the PLL circuit 2, an adder 24 detects the difference between the two values stored in the registers 22 and 23 and provides the difference to a DA converter 25, which converts it into an analog voltage. The analog voltage is supplied to the VCO 3.

The analog voltage controls the VCO 3 to zero the frequency difference between the transmission and internal clock signals. This control technique is well known as a PLL. The VCO 3 generates the 27-MHz internal clock signal that is used to drive the counter 21 and is supplied to a clock multiplier 31, which generates, for example, 81-MHz and 44.1-KHz clock signals. The 81-MHz clock signal is used to generate video signals, and the 44.1-KHz clock signal is used to generate audio signals.

The 27-MHz internal clock signal is used to transform a brightness signal (Y) and a color signal (Cr, Cb) into an NTSC signal. The NTSC signal is a mixture of the brightness signal, the color signal, a vertical sync signal to specify the start of a vertical period of a TV image, and a horizontal sync signal to specify the start of a horizontal period of the TV image.

The color signal consists of chrominance signals Cr and Cb. The frequencies of the signals Cr and Cb are limited to a 0.5-MHz band, and the signals are subjected to balanced modulation. The modulated signals are added to the brightness signal Y. To carry out the balanced modulation, a 3.58-MHz sine wave sin-X and a cosine wave cos-X (sin (x+90)) whose phase is shifted by 90 degrees from the sine wave are digitally generated from the 27-MHz internal clock signal. A multiplier 92 multiplies the chrominance signal Cr by the sine wave, and a multiplier 91 multiplies the chrominance signal Cb by the cosine wave. Then, the outputs of the multipliers 91 and 92 are added to each other by an adder 93. The output of the adder 93 is added to the brightness signal Y by an adder 94. The output of a synchronous signal generator 97, which generates various synchronous signals such as a horizontal synchronous signal, a vertical synchronous signal, and a color burst synchronous signal, is applied to the adder 94. The output of the adder 94 is supplied to a DA converter 98, which provides an NTSC composite signal.

The sine wave and cosine wave are shifted from each other by 90 degrees. Accordingly, the sine wave, i.e., the chrominance signal Cr, is extractable from the NTSC composite signal at a time of sin 90° (=1), i.e., cos 90° (=0). On the other hand, the cosine wave, i.e., the chrominance signal Cb is extractable from the NTSC composite signal at a time of sin 0° (=0), i.e., cos 0° (=1). In this way, the modulated chrominance signals Cr and Cb are extracted, i.e., demodulated.

In the NTSC encoder 9, the sum of the balance-modulated chrominance signals Cr and Cb, i.e., the output of the adder 93 is added to the brightness signal Y in the adder 94. It is impossible to completely separate the brightness signal Y from the color signal (Cr plus Cb). Since the color signal is modulated according to 3.58-MHz carriers, the band of the color signal may be limited to, for example, 0.5 MHz. In this case, components of the color signal concentrate at around 3.58 MHz ±0.5 MHz. On the other hand, the band of the brightness signal Y is not limited, and therefore, the brightness signal Y spreads in the range of 0 to 4 MHz. Statistically, however, most of the signal components concentrate in a low-frequency band in the range of 0 to 2 MHz. Therefore, by neglecting high-frequency components of the brightness signal, it is possible to separate, with the use of band-pass filters, the brightness signal Y from the color signal (Cr, Cb). The band-pass filters to separate the signals from each other include a band-pass filter of 3.58 MHz ±0.5 MHz and a band-pass filter of 0 to 3 MHz. Although there are several known methods to completely separate these signals from each other, they will not be explained because they are not directly related to the present invention.

As mentioned above, the adder 94 receives the output of the synchronous signal generator 97 including a horizontal synchronous signal, a vertical synchronous signal, and a color burst synchronous signal. These signals are multiplexed into one in a blanking period in which no brightness and color signals are present. The color burst synchronous signal is used to determine the timing of extracting the color signal, i.e., the sine and cosine waves. The television set 10 (FIG. 1) employs a PLL circuit to extract the sine wave in synchronization with the color burst synchronous signal, and then, separates the chrominance signals Cr and Cb from each other.

According to the prior art, the VCO 3 of the PLL circuit 2 contains many analog elements that are improper for large-scale integration. Accordingly, the PLL circuit 2 must be arranged outside a digital LSI.

Since the conventional PLL circuit has many analog elements, it is not suitable for mass production, and therefore, is very expensive and increases the cost of the MPEG decoder in which the PLL circuit is arranged.

This problem is not limited only to the PLL circuit in the MPEG decoder but is intrinsic to all conventional PLL circuits.

Now, digital PLL circuits and MPEG decoders according to preferred embodiments of the present invention will be explained with reference to the drawings.

Figure 3:
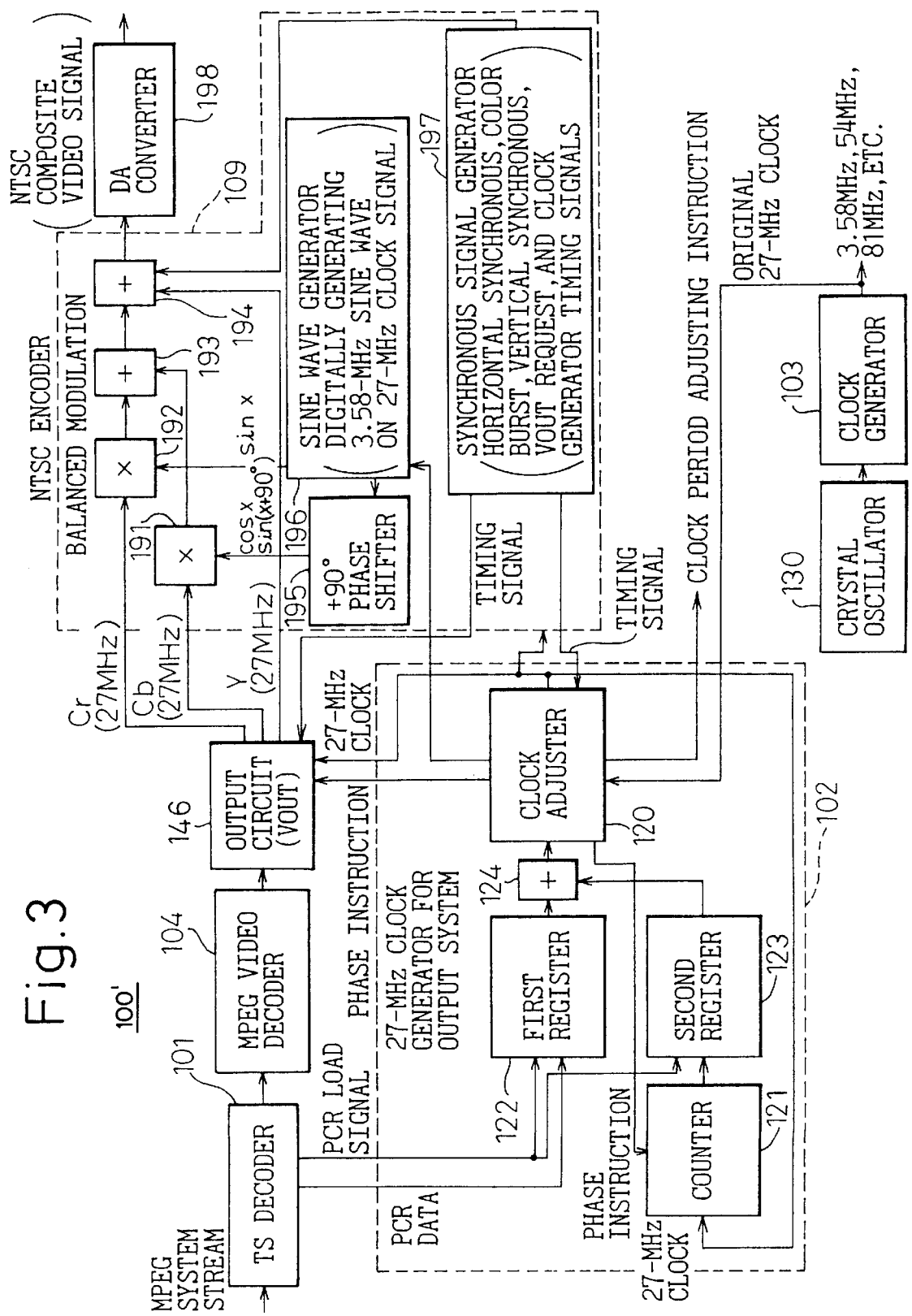
FIG. 3 is a block diagram showing a digital PLL circuit according to a first embodiment of the present invention.

FIG. 3 is a block diagram showing a digital PLL circuit 102 according to the first embodiment of the present invention. The PLL circuit 102 is incorporated in an MPEG decoder 100' and serves as a 27-MHz clock signal generator for an output system of the MPEG decoder 100'. The MPEG decoder 100' has a TS (transmission stream) decoder 101, the PLL circuit 102, a clock generator 103, a crystal oscillator 130, an MPEG video decoder 104, an output circuit 146, an NTSC encoder 109, and a DA converter 198. The TS decoder 101 and MPEG video decoder 104 operate on a clock signal provided by the clock generator 103.

The digital PLL circuit 102 of the embodiment needs none of the DA converter 25 and VCO 3 of the prior art of FIG. 2. Instead, the PLL circuit 102 employs the oscillator 130, clock generator 103, and a clock adjuster 120.

The PCR (program clock reference) contained in an MPEG transmission stream is stored in a first register 122. The internal clock signal generated by the digital PLL circuit 102 is stored in a second register 123. The internal clock signal is based on the output of the oscillator 130, and the frequency of the internal clock signal is not adjusted because the PLL circuit 102 has no VCO 3 of FIG. 2. The registers 122 and 123 provide the frequency difference between the transmission and internal clock signals, and the clock adjuster 120 adjusts the frequency difference. Namely, the clock adjuster 120 provides, based on an original 27-MHz clock signal, an adjusted 27-MHz clock signal and phase adjusting information. The phase adjusting information indicates the degree of phase adjustment made on the original 27-MHz clock signal.

The details of the adjustment made by the clock adjuster 120 will be explained later. The adjustment is done by digital circuits that shift the phase of the original 27-MHz clock signal according to PCR.

Suppose a value counted by a 27-MHz counter 121 stored in the register 123 is greater than a PCR value stored in the register 122 by 20, to indicate a surplus of 20 clock periods, or clock pulses. Since two consecutive PCRs in an MPEG transmission stream correspond to 0.1 seconds, i.e., 2,700,000 clock periods, the 20-clock-period surplus indicates that the counter 121 has counted 2,700,020 clock periods (clock pulses) in the interval of 0.1 seconds between two PCRs. Namely, 0.1 seconds plus 20 clock periods pass in the MPEG decoder while 0.1 seconds pass in the transmitter that sends the MPEG transmission stream. This means that the MPEG decoder must process more information for the 20 clock periods than information transmitted. Twenty clock periods are equal to 760 nsec, and therefore, the difference of 20 clock periods will cause no problem if it occurs singularly in the MPEG decoder because a VBV buffer of the MPEG decoder keeps reserves of compressed information to be processed during the 20 clock periods. However, if the difference of 20 clocks occurs every 0.1 seconds for a long time, the reserves in the VBV buffer will completely be consumed and there will be no image to display.

To avoid this problem, it is necessary to adjust the video processing speed of the MPEG decoder to PCRs in the MPEG transmission stream. Namely, the difference of 20 clock periods in 0.1 seconds must be zeroed by shortening clock periods of the internal clock signal of the MPEG decoder. The internal clock signal must be adjusted in, for example, a beam returning period (blanking period) when no images are displayed on the television set. It is preferable to distribute the adjusting periods over 0.1 seconds, to minimize a disturbance of displayed images.

Adjusting clock periods may be carried out by instantaneously changing a clock period of 37 nsec of the 27-MHz internal clock signal to 49, 25, 43, 31, or 18.5 nsec. Alternatively, counters that control the timing of circuit operations in the MPEG decoder may be incremented by +2, +3, −1, or −2 instead of a usual increment of +1. If the internal clock signal is adjusted in this way, digital circuits that generate a color sub-carrier of 3.58 MHz used to carry out the balanced modulation on a color signal in the NTSC encoder 109 will operate differently. Namely, if the phase of the color sub-carrier shifts, the hue of an image will change. The phase shift of the color sub-carrier, therefore, must be corrected. For this purpose, the phase adjusting information is used to inform a 3.58-MHz carrier generator in the NTSC encoder 109 of the phase shift occurred on the 27-MHz internal clock signal. The details of this will be explained later.

The counter 121, synchronous signal generator 197, etc., will be adjusted by adjusting the phase of the 27-MHz internal clock signal or by employing the phase adjusting information.

Adjusting the phase of the 27-MHz internal clock signal raises a problem. This problem will be explained. If the phase of the internal clock signal is adjusted, the signal will have a shortage or surplus of clock pulses. If two clock pulses are generated in a usual clock period of the internal clock signal, any counter for counting the pulses of the signal must instantaneously double its counting speed. Although doubling the speed of the counter is possible, it is preferable not to do so. A more preferable clock adjusting technique than increasing the counter speed is to employ the phase adjusting information to inform the counter 121, etc., that two pulses are included in a given clock period, and therefore, the counter must increment its value by +2 in the clock period.

The technique of employing the phase adjusting information is more effective when three clock pulses must be included in a single clock period. In this case, the counter is simply incremented by +3 at the moment, instead of tripling the operation speed thereof. This technique is also effective when some clock pulses must be removed. This is done by incrementing the counter by −1, −2, −3, or another number. In this way, the technique adjusts the 27-MHz internal clock signal only by manipulating the phase adjusting information without actually adjusting the clock signal supplied to the counters related to the internal clock signal. The counters to be controlled according to the phase adjusting information include the counter 121 and a counter that controls the timing of the NTSC encoder 109.

The counter for controlling the NTSC encoder 109 counts a frame period and a horizontal period, to determine the timing of a horizontal synchronous signal, vertical synchronous signal, color burst signal, color signal, and brightness signal in each frame period. Adjusting this counter adjusts a speed of processing and displaying NTSC signals.

The adjusted internal clock signal and phase adjusting information are used to drive some of the circuits that form the MPEG decoder 100', such as the output circuit 146, NTSC encoder 109, and counter 121. The MPEG video decoder 104 may be driven with the original 27-MHz clock signal. Namely, only the circuits that directly relate to the processing and displaying of video signals receive the adjusted clock signal and phase adjusting information. This is because compressed images separated from an MPEG transmission stream are once stored in the VBV buffer (261, 361), and then, are read and displayed.

An MPEG video output circuit (249, 349) reads images out of the VBV buffer (261, 361) whenever it needs them. Due to this buffer, it is possible to employ different clock signals for the decoding process and displaying process. Unlike the circuits for handling video signals, circuits for handling audio signals carry out no modulation with color sub-carriers but simply provide audio digital data. Accordingly, it is required to adjust the phase of a basic audio clock signal such as 384Fs with the use of the clock adjuster 120.

Figure 4:
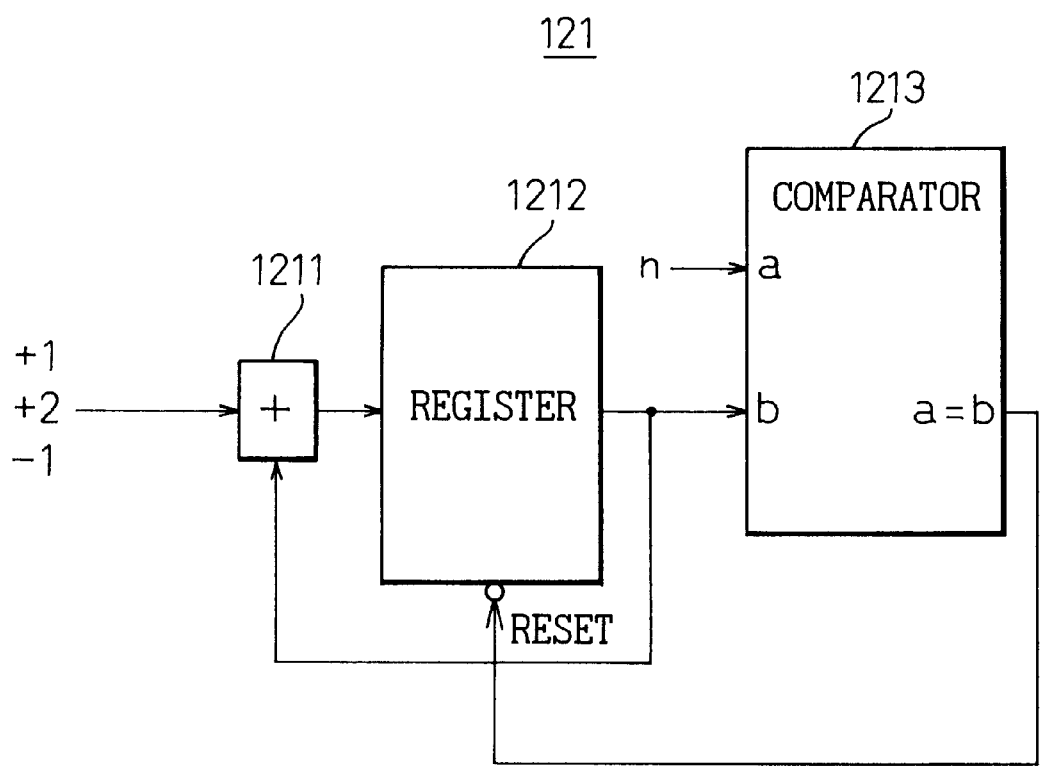
FIG. 4 is a block diagram showing a counter incorporated in the digital PLL circuit of FIG. 3.

FIG. 4 is a block diagram showing an example of the counter 121 contained in the digital PLL circuit of FIG. 3.

The counter 121 has an adder 1211, a register 1212, and a comparator 1213.

The adder 1211 receives the phase adjusting information representing any one of +1, +2, and −1 from the clock adjuster 120, adds the same to a value stored in the resister 1212, and returns the sum to the register 1212. The output of the register 1212 is supplied to an input terminal b of the comparator 1213. The other input terminal a of the comparator 1213 receives a signal n. If a=b, the comparator 1213 resets the register 1212.

Figure 5:
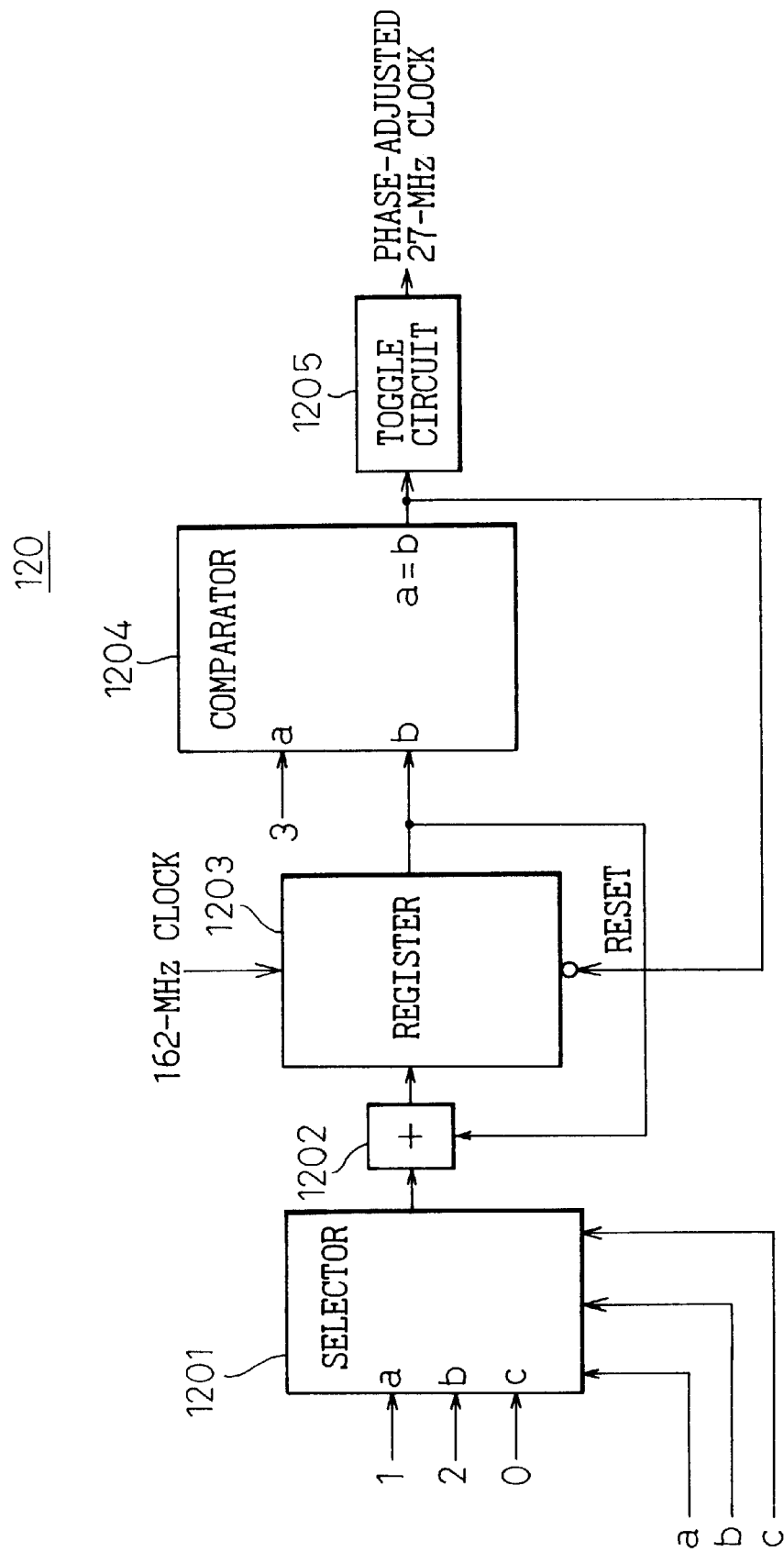
FIG. 5 is a block diagram showing a clock adjuster incorporated in the digital PLL circuit of FIG. 3.

FIG. 5 is a block diagram showing an example of the clock adjuster 120 contained in the PLL circuit 102 of FIG. 3.

The clock adjuster 120 has a selector 1201, an adder 1202, a register 1203, a comparator 1204, and a toggle flip-flop 1205.

The selector 1201 receives a signal representing any one of +1, +2, and 0 from the adder 124, selects a proper one of them, and supplies the selected one to the adder 1202. The adder 1202 adds the received one to a value stored in the register 1203 and returns the sum to the register 1203. The register 1203 receives a clock signal of 162 MHz. The output of the register 1203 is supplied to an input terminal b of the comparator 1204. The other input terminal a of the comparator 1204 receives a signal representing "3." If a=b=3, the comparator 1204 resets the register 1203. The output of the comparator 1204 is supplied to the toggle circuit 1205, which supplies a phase-adjusted clock signal of 27 MHz (162 MHz/6).

Figure 6:
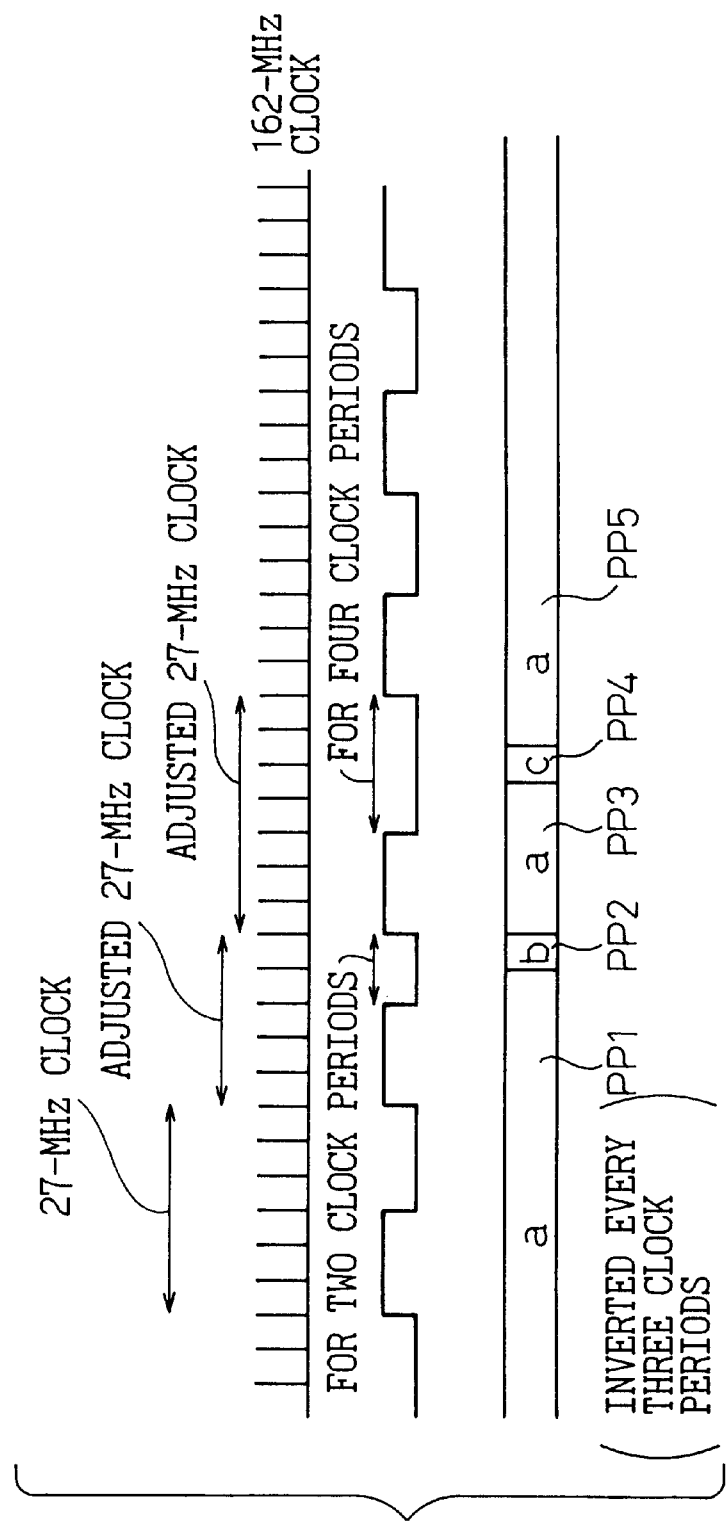
FIG. 6 is a timing chart showing the operation of the clock adjuster of FIG. 5.

FIG. 6 is a timing chart showing the operation of the clock adjuster 120 of FIG. 5.

In a normal state (PP1, PP3, PP5), the selector 1201 receives a signal to select the terminal a thereof. As a result, the selector 1201 selects "1" and supplies it to the adder 1202. At this time, the terminal a of the comparator 1204 receives "3," and therefore, the toggle circuit 1205 provides the clock signal of 27 MHz that is inverted every three clock periods (clock pulses) of the 162-MHz clock signal.

In a period PP2, the selector 1201 receives a signal to select the terminal b thereof, to advance the phase of the output signal of the toggle circuit 1205. Namely, the selector 1201 selects "2" and supplies it to the adder 1202. This inverts the output signal of the toggle circuit 1205 after two clock periods of the 162-MHz clock signal. In a period PP4, the selector 1201 receives a signal to select the terminal c thereof, to delay the phase of the output signal of the toggle circuit 1205. Namely, the selector 1201 selects "0" and supplies it to the adder 1202. This results in not counting a clock period of the 162-MHz clock signal, so that the output signal of the toggle circuit 1205 is inverted after four clock periods of the 162-MHz clock signal. In this way, the clock adjuster 120 provides a phase-adjusted 27-MHz clock signal.

The clock signal supplied to the register 1203 is not limited to the 162-MHz clock signal. For example, it may be a clock signal having a frequency of n times 27 MHz, where n is a positive integer. In this case, the value "n" supplied to the input terminal a of the comparator 1204 is changed accordingly.

Figure 7:
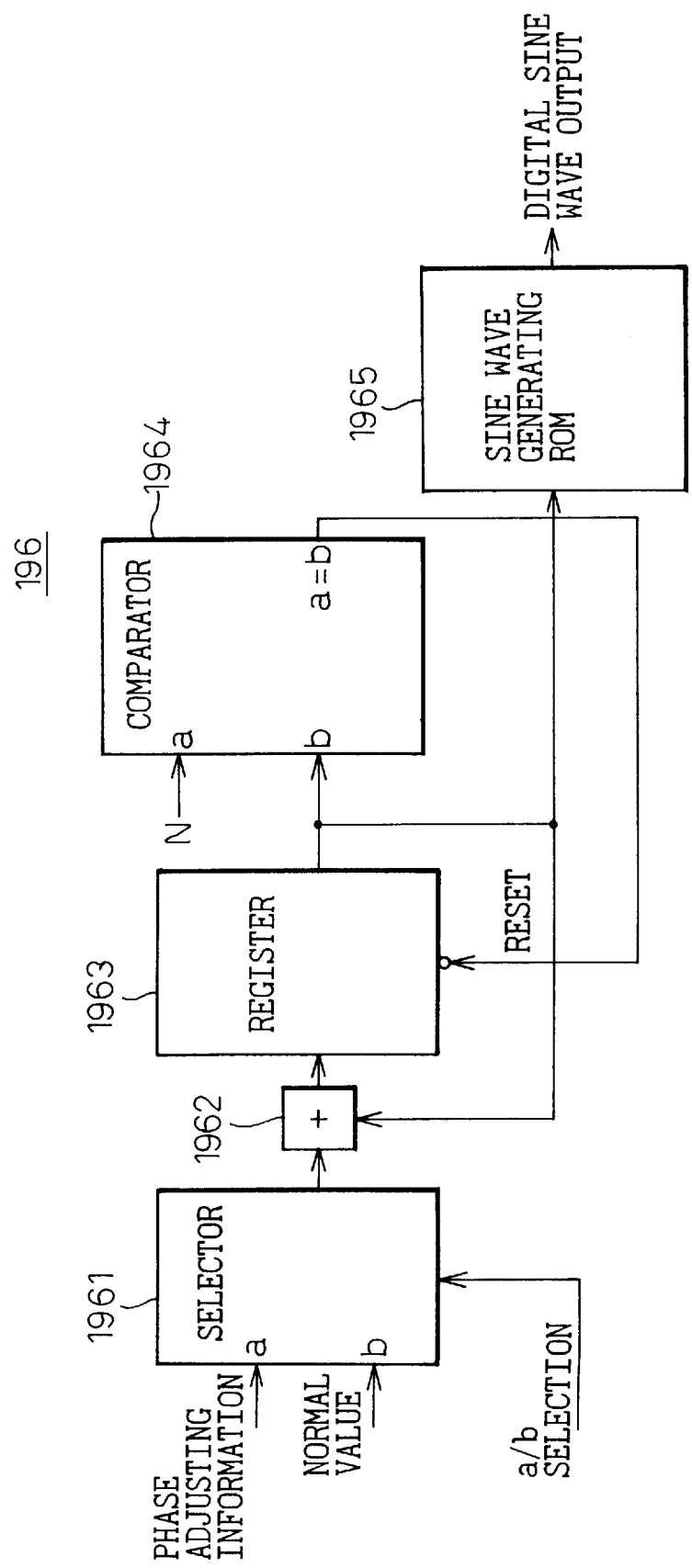
FIG. 7 is a block diagram showing a sine wave generator incorporated in the digital PLL circuit of FIG. 3.

FIG. 7 is a block diagram showing an example of the sine wave generator 196 of FIG. 3, and FIG. 8 is a timing chart showing the operation thereof.

The sine wave generator 196 has a selector 1961, an adder 1962, a register 1963, a comparator 1964, and a sine wave generating ROM 1965. The selector 1961 receives the phase adjusting information from the clock adjuster 120 and a normal value, selects one of them according to a select signal, and supplies the selected one to the adder 1962. The output of the adder 1962 is supplied to an input terminal b of the comparator 1964 through the register 1963. The comparator 1964 compares it with a value N that is supplied to an input terminal a thereof. If a=b, the comparator 1964 resets the register 1963. The output of the register 1963 is supplied to the ROM 1965, which provides a corresponding value to form a sine wave.

In FIG. 8, PP01 is a period in which the selector 1961 selects the normal value b, and PP02 is a period in which the selector 1961 selects the phase adjusting information so that each normal value is reduced by 2. The sine wave provided by the sine wave generator 196 is used by the MPEG video output circuit (249, 349) as will be explained later with reference to FIGS. 11A, 11B, 14A, and 14B.

FIGS. 9A to 9D are block diagrams showing a digital PLL circuit according to the second embodiment of the present invention.

A TS (transmission stream) decoder 201 decomposes an MPEG transmission stream into an MPEG-2 video stream, an MPEG audio stream, etc. The video stream includes MPEG-2 compressed video information such as I-, P-, and B-pictures. This compressed video information is once stored in a VBV buffer 261. When a video decoder core 204 becomes ready to expand the information, the core 204 sends a request signal REQ1 to the VBV buffer 261, which then supplies the compressed video information to the core 204. The core 204 decodes the received information.

The decoded image data is stored in a decoded image memory 262. Upon receiving a data request signal REQ2 from an output circuit 246, the memory 262 supplies the decoded image data to the output circuit 246, which transfers it to a switch 236 through an MPEG video output circuit 249. More precisely, the MPEG video output circuit 249 receives a frame time signal FT, provides the output circuit 246 with an enable signal, and provides the switch 236 with the decoded image data (a video signal) and an enable signal.

The above is a basic video decoding process. A PCR (program clock reference) synchronization mechanism that is an essential part of the digital PLL circuit of the present invention arranged in the MPEG decoder will be explained.

PCR is used to synchronize a video stream input speed with a video displaying speed. If these speeds are asynchronous with each other, for example, if the video stream input speed is slower than the video displaying speed, there will be a shortage of images to display. Then, the viewer will see a black screen or a frozen image. This sort of incorrect displaying is dependent on MPEG decoders. Some MPEG decoder may darken the screen whenever there is no compressed video stream to process, and some may continuously display a preceding image when there is a shortage of images to display.

If the video stream input speed is faster than the video displaying speed, the VBV buffer 261 will be full of transmitted data, and therefore, must abandon part of the stored data.

In this way, asynchronism between the video stream input speed and the displaying speed provides the viewer with incorrect images. Accordingly, the MPEG international standards insert 27-MHz PCRs in an MPEG transmission stream so that the MPEG decoder can synchronize the displaying speed thereof with the PCRs, thereby synchronizing the displaying speed with the video stream input speed. Transmitting PCRs will be explained.

A transmitter expresses a certain time A with a value counted on a 27-MHz clock signal and time-division-multiplexes the value as PCR in an MPEG transmission stream. Thereafter, the transmitter expresses a certain time B with a value counted on the 27-MHz clock signal and transmits it as another PCR in the same manner. Suppose the value at the time A is 100 and the value at the time B is 300. Then, the transmitter considers that 200 clock periods has passed between the time A and the time B and expects a receiver to display images for the 200 clock periods.

On the other hand, the receiver, i.e., the MPEG decoder has its own 27-MHz counter to measure the period between the time A and the time B. Suppose the MPEG decoder counts 210 clock periods (clock pulses) between the time A and the time B. This means that the receiver displays more images for the difference of 10 clock periods than expected by the transmitter. This must be corrected. The prior art of FIG. 2 makes this correction with the PLL circuit to control the voltage of the 27-MHz VCO (VCXO), thereby controlling the oscillation frequency of the VCO.

The PLL circuit of the present invention carries out the correction without the VCXO that is expensive.

PCRs used for MPEG video synchronization are time-division-multiplexed in an MPEG transmission stream and must be updated at intervals of at least 0.1 seconds according to the international standards. PCR is inserted into an MPEG transmission stream with a special pattern, and the TS decoder 201 separates the PCR from the stream based on the special pattern and decodes the same into a PCR value.

When a PCR load signal is turned on, a latest PCR value is supplied from the TS decoder 201 to a PCR register 222 and is stored therein. An adder 224 compares the value in the PCR register 222 with the output of a 27-MHz counter 221 and provides the difference between them. A multiplier 225 multiplies the difference by 0.5 and stores the product in a PCR deviation register 226. These elements form a primary PLL, and the coefficient 0.5 corresponds to a PLL filter gain. If the coefficient of the multiplier 225 is smaller than 0.5, the stability of the PLL improves but a synchronization time elongates. Accordingly, the coefficient of the multiplier 225 must carefully be determined according to conditions required for the system. Instead of the primary PLL, a secondary PLL, etc., is employable.

Table 1 shows frequency control carried out by the PLL.

The technique of the second embodiment of correcting an increment in the internal clock signal will be explained. This correction is not done by correcting the oscillation frequency of the 27-MHz internal clock signal generated by the 27-MHz oscillator disposed in the MPEG decoder. Instead, it is done by adjusting a blanking period between TV signals that are generated based on MPEG video signals.

The second embodiment employs a value stored in the PCR deviation register 226, to correct a blanking period between TV signals. Namely, the second embodiment increases or decreases a horizontal blanking period in units of 27-MHz clock periods.

Figure 9A:
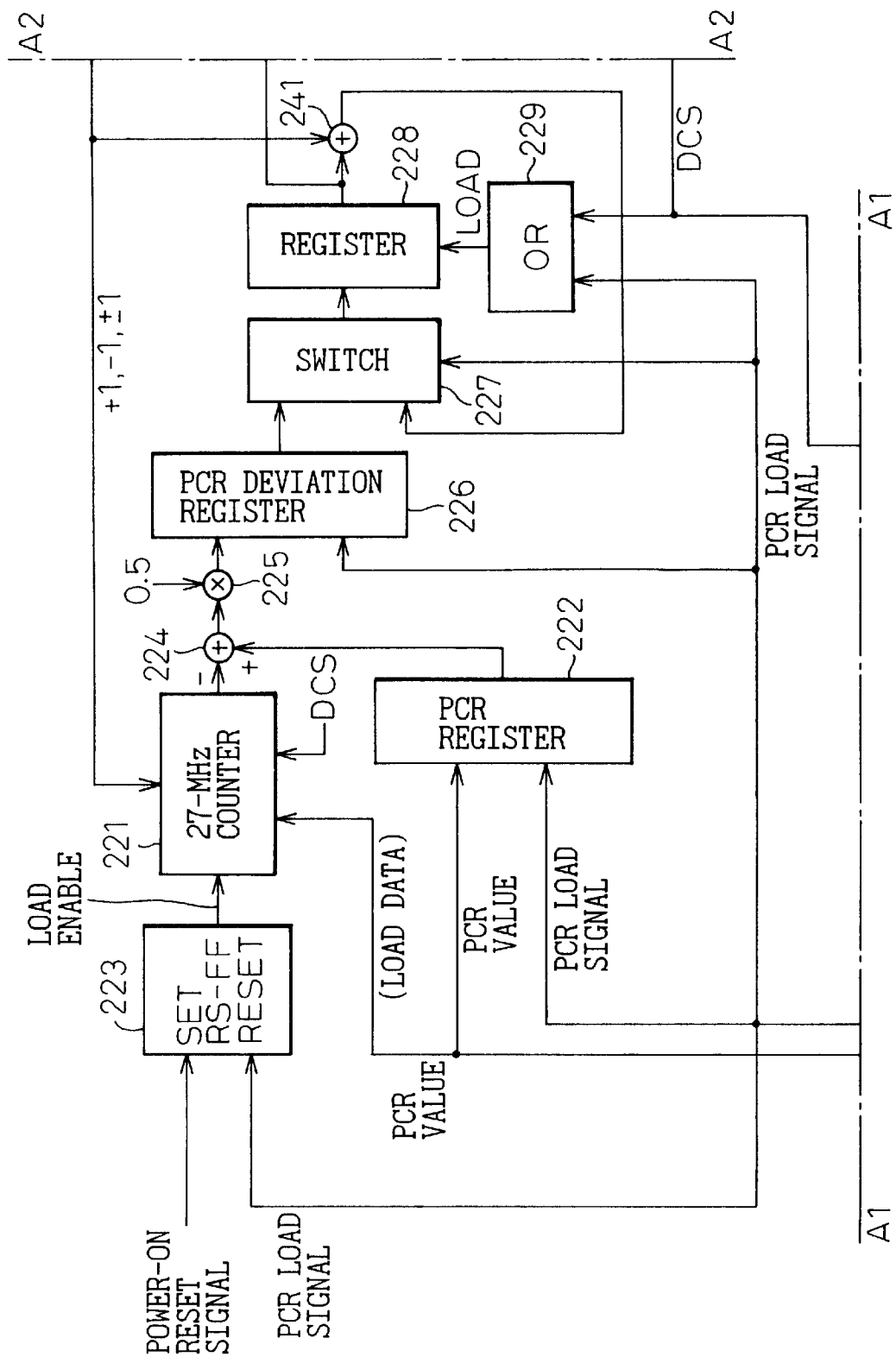
FIGS. 9A to 9D are block diagrams showing a digital PLL circuit according to a second embodiment of the present invention.
Figure 9B:
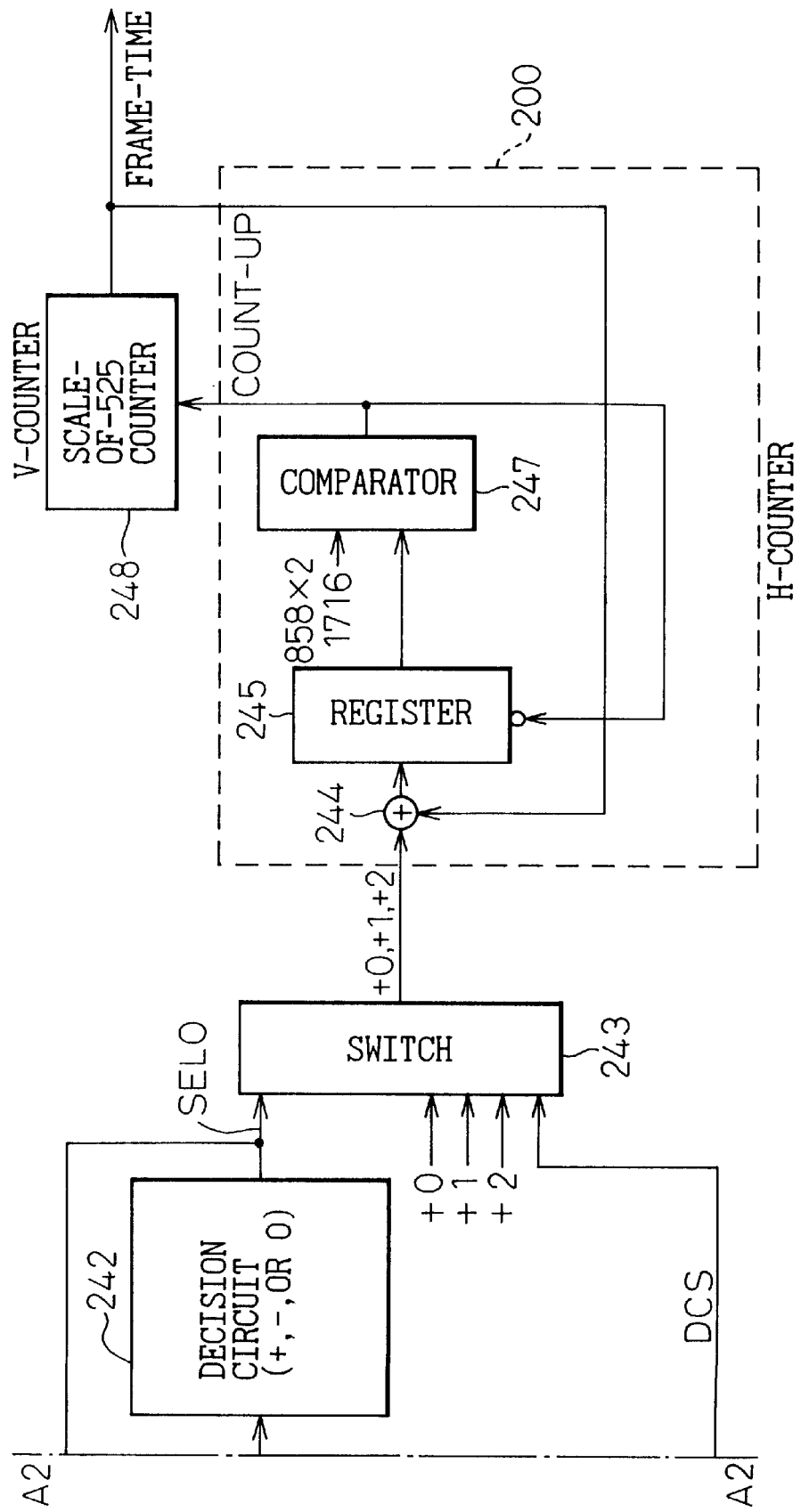
Figure 9C:
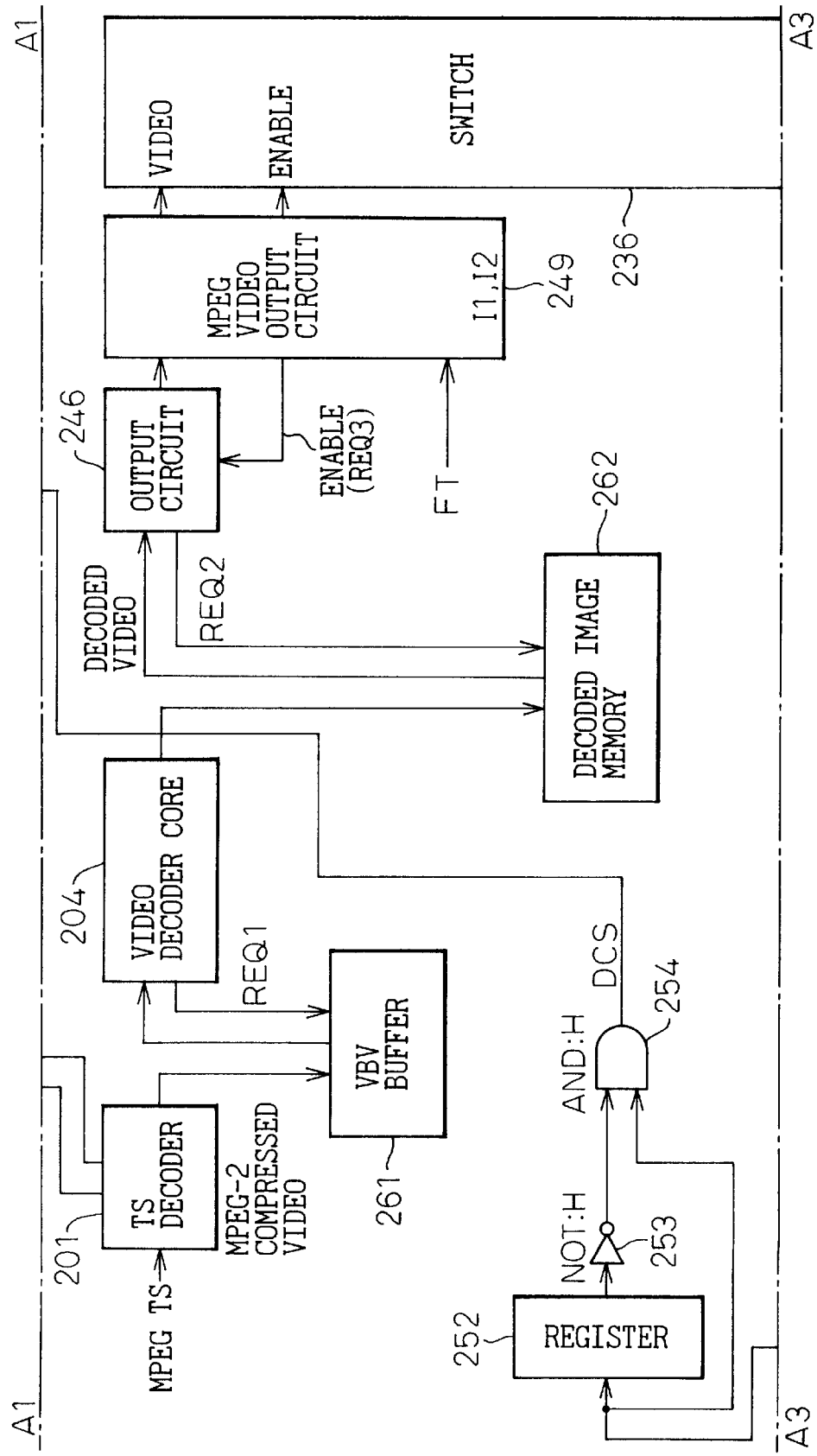
Figure 9D:
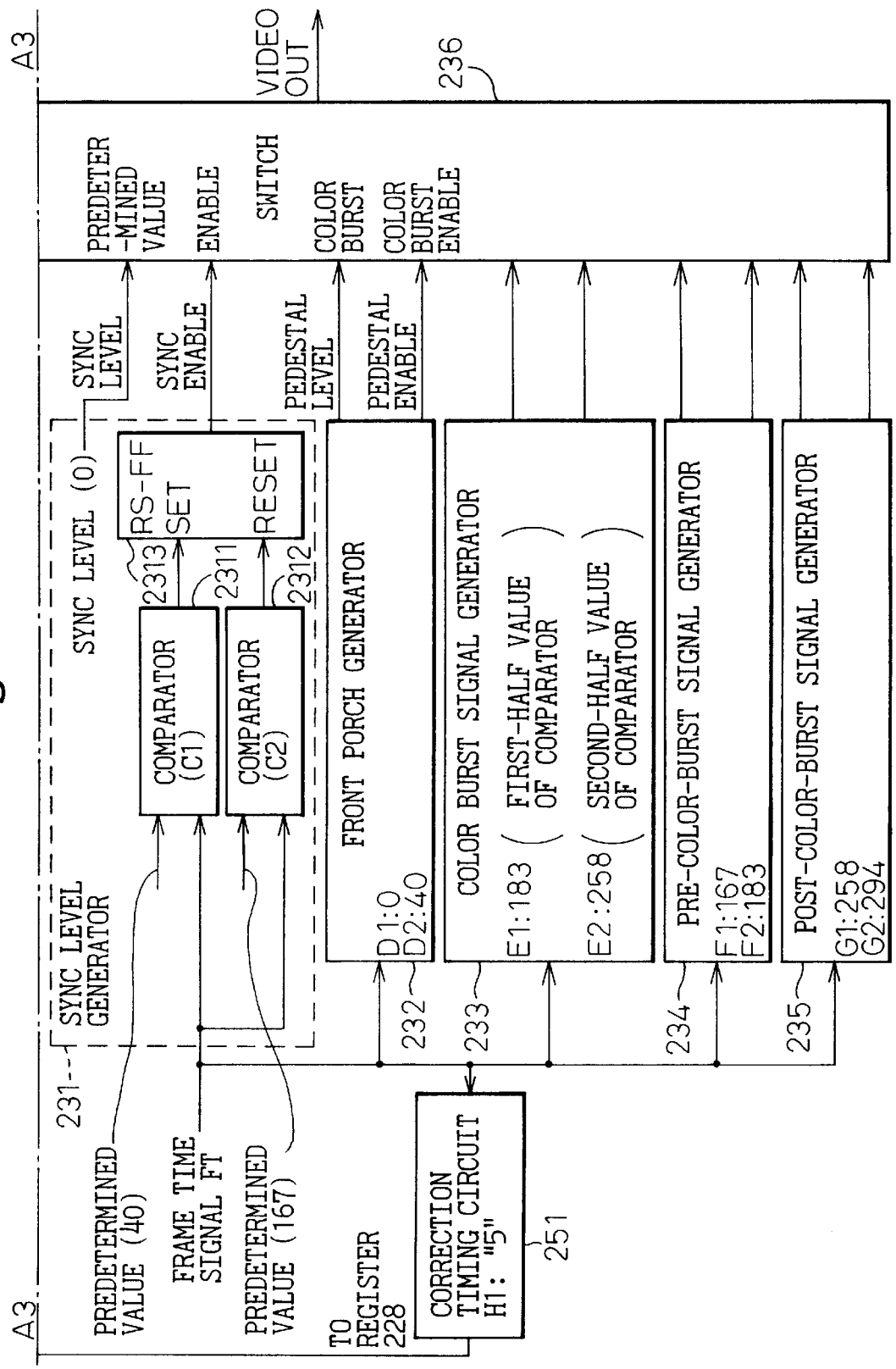
Figure 10:
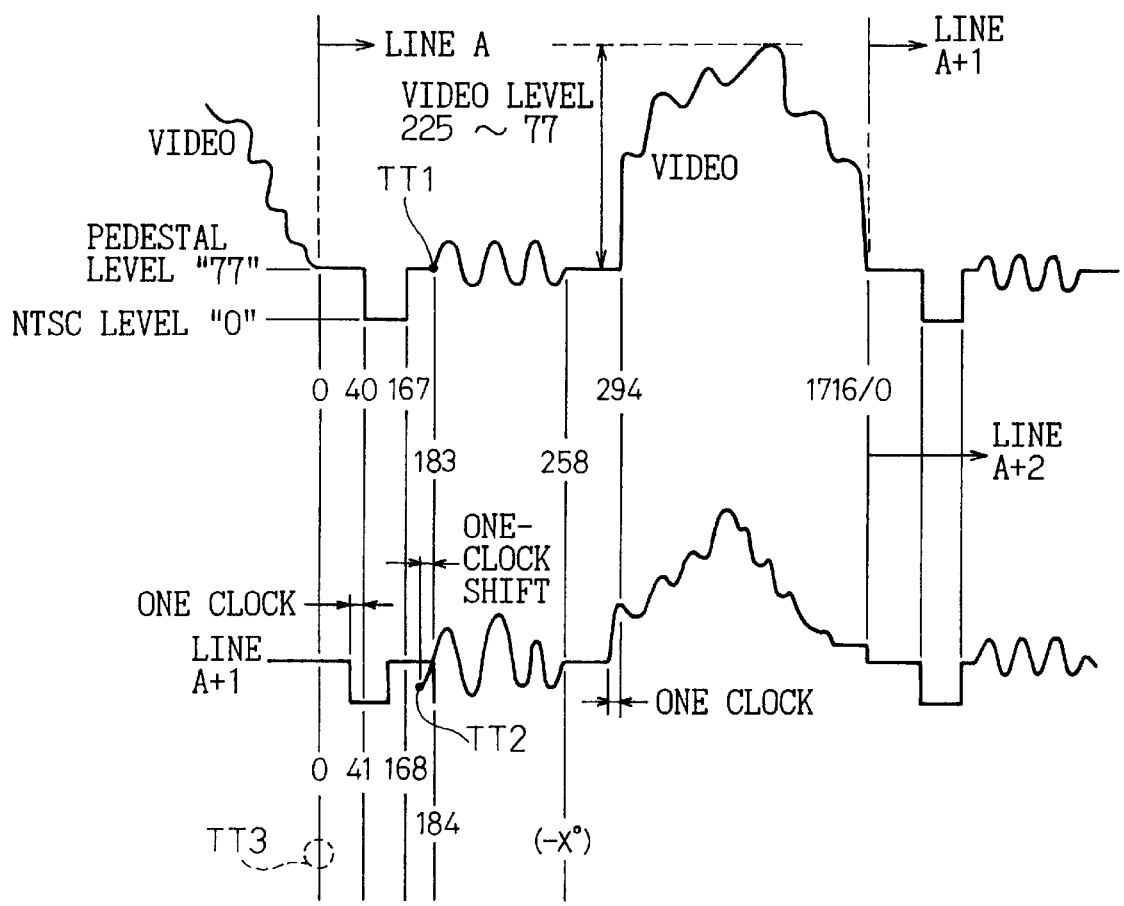
FIG. 10 is a timing chart showing the operation of the digital PLL circuit of FIGS. 9A to 9D.

FIG. 10 is a timing chart showing the operation of the digital PLL circuit of FIGS. 9A to 9D. TT1 is a phase-0° position in a line A, TT2 is a phase -X° position in a line A+1, the position TT2 being shifted from the position TT1 by a clock period, and TT3 is a position where the counter 221 is incremented by +2.

Storing a value in the PCR deviation register 226 will be explained in detail. The difference between a value counted by the counter 221 and a PCR value provided by the TS decoder 201 is supplied from the adder 224 to the PCR deviation register 226. The value provided by the counter 221 is related to the internal clock signal of the MPEG decoder. The PCR value provided by the TS decoder 201 is related to PCR that is time-division-multiplexed in an MPEG transmission stream. When the MPEG decoder is turned on, the counter 221 is initialized by resetting an RS flip-flop 223 in response to a power-on reset signal.

Just after the MPEG decoder is turned on, the TS decoder 201 provides a first PCR value and a PCR load signal to

TABLE 1

|  | A | B | C | D | E | F | G | H | I | J | K |
| --- | --- | --- | --- | --- | --- | --- | --- | --- | --- | --- | --- |
| PCR REGISTER OUTPUT | 1100 | 2200 | 3300 | 4400 | 5500 | 6600 | 7700 | 8800 | 9900 | 11000 | 12100 |
| 27-MHz COUNTER OUTPUT | 1000 | 2050 | 3125 | 4213 | 5307 | 6404 | 7502 | 8601 | 9701 | 10801 | 11901 |
| DIFFERENCE | 100 | 150 | 175 | 187 | 193 | 196 | 198 | 199 | 199 | 199 | 199 |
| FEEDBACK (x0.5) | 50 | 75 | 88 | 94 | 97 | 98 | 99 | 100 | 100 | 100 | 100 |
| CLOCK INCREASE | 1050 | 1075 | 1088 | 1094 | 1097 | 1098 | 1099 | 1100 | 1100 | 1100 | 1100 |

In Table 1, the PCR register output is a PCR value transmitted with an MPEG transmission stream at predetermined intervals of, for example, 0.1 seconds. In this embodiment, the PCR value is incremented by 1100 at a time. Suppose the oscillation frequency of the 27-MHz internal clock signal generated by a 27-MHz oscillator installed in the MPEG decoder is slightly incorrect and increments the 27-MHz counter 221 by 1000 at intervals of 0.1 seconds. In this case, the internal clock signal must be feedback-controlled so that it may increment the counter 221 by 1100 at the same intervals. Table 1 shows the process of feedback-controlling the internal clock signal.

At time A, the difference between the output of the PCR register 222 and the output of the counter 221 is 100 (=1100−1000). The difference of 100 is multiplied by 0.5, to provide a product of 50, which is fed back to the internal clock signal. As a result, the counter 221 shows an increment of 1050 at time B.

Thereafter, an increment by the counter 221 between the time B and time C becomes 1075. These processes are repeated, and lastly, an increment by the counter 221 in each 0.1 seconds becomes 1100 as shown in Table 1, to agree with an increment in PCRs. This establishes PLL synchronization, i.e., synchronization between the transmission clock signal and the internal clock signal.

indicate that the PCR value has just been updated. In response to the PCR load signal, the PCR value is set in the counter 221. At the same time, the PCR load signal resets the RS flip-flop 223 so that the counter 221 may not be initialized when the PCR value is updated next time. The PCR value is also stored in the PCR register 222 in response to the PCR load signal.

In this initial state, the counter 221 and PCR register 222 have the identical value. Namely, the difference between the values of the counter 221 and PCR register 222 is zero. When a second PCR value is detected, there will be a difference between values provided by the counter 221 and PCR register 222. The difference, i.e., the output of the adder 224, is multiplied by 0.5 by the multiplier 225, and the product is stored in the PCR deviation register 226.

The PCR deviation register 226 receives the PCR load signal so that the value in the PCR deviation register 226 is updated whenever the PCR value is updated. The value in the PCR deviation register 226 is temporarily stored in a register 228 through a switch 227. The register 228 is connected to a horizontal synchronous counter (H-counter) 200 for measuring a horizontal period according to TV signals, and to a vertical synchronous counter (V-counter) 248 for measuring a frame period.

The H-counter 200 operates on the 27-MHz clock signal, to count 1716 as one horizontal period. The second embodiment forms the H-counter 200 with an adder 244, a register 245, and a comparator 247. When a value stored in the register 245 becomes 1716, the comparator 247 provides a signal to zero the register 245 and increment the V-counter 248.

The reason why the H-counter 200 is composed of the adder 244, register 245, and comparator 247 is to enable the H-counter 200 to be incremented not only by +1 but also by +0 or +2. The +0-increment is equal to no count and results in doubling a clock period, and the +2-increment is equal to half a clock period. The second embodiment employs any one of +1, +0, and +2 as an incremental value to correct the internal clock signal. This correction must be carried out during a blanking period between TV signals. A structure to achieve this will be explained.

The outputs of the H-counter 200 and V-counter 248 form a frame time signal FT representing a certain time in one image frame and is supplied to a sync level generator 231, a front porch generator 232, a color burst signal generator 233, a pre-color-burst signal generator 234, a post-color-burst signal generator 235, and a correction timing circuit 251. Namely, the frame time signal FT is supplied to comparators 2311 (C1), 2312 (C2), D1, D2, E1, E2, F1, F2, G1, G2, and H1 to cause predetermined operations at given time points.

In FIG. 10, a horizontal period is counted from 0 to 1716 with the 27-MHz clock signal. In the horizontal period, a period between 0 and 40 is a front porch period of TV signals, a period between 40 and 167 is a synchronous signal period, a period between 167 and 183 is a pre-color-burst signal period, a period between 183 and 258 is a color burst signal period, a period between 258 and 294 is a post-color-burst signal period, and a period between 294 and 1716 is an MPEG video displaying period. During a blanking period, a time 5 is a deviation correction time.

The comparator H of the correction timing circuit 251 of FIG. 9D detects the time 5. At this time, a deviation correction signal DCS is supplied to the register 228 and switch 243. The signal DCS is a pulse signal whose width is equal to a clock period of the 27-MHz clock signal. Accordingly, the signal DCS is not directly the output of the correction timing circuit 251 but is a signal passed through a register 252, an inverter 253, and an AND gate 254. These elements 252, 253, and 254 form a differential circuit to provide a "1" output, only when the output of the correction timing circuit 251 changes from "0" to "1." If this differential circuit is not provided, the H-counter 200 will consecutively provide the time 5 when it is incremented by +0. This will make the signal DCS always "1." To avoid this, the differential circuit must be arranged.

A decision unit 242 determines whether the output of the register 228 is positive (+), negative (−), or zero (0). If it is +, the deviation is plus, i.e., a counted value based on the 27-MHz clock signal is smaller than the PCR value. Then, the decision unit 242 provides the switch 243 with a select signal to select +2. The output of the switch 243 is supplied to the register 245 of the H-counter 200. Usually, the deviation correction signal DCS is OFF, and the output of the switch 243 is +1 to normally increment the H-counter 200 by +1.

Only when the deviation correction signal DCS is ON, the switch 243 provides the adder 244 with +2 selected by the output of the decision unit 242. Then, the output of the H-counter 200 is changed accordingly. Namely, a horizontal synchronous period is shortened by one clock period, to quicken the video display timing by one clock period. This correction is carried out during a blanking period so that the correction does not influence images to be displayed.

If the output of the register 228 is 0, the select signal provided by the decision unit 242 makes the switch 243 select +1. If the output of the register 228 is negative (−), the select signal makes the switch 243 select 0. In this case, the incremental operation of the H-counter 200 is delayed by one clock period when the deviation correction signal DCS is provided. This results in extending the output of the H-counter 200, i.e., a horizontal synchronous period by one clock period, thereby delaying video displaying timing by one clock period. This correction is carried out during a blanking period so that the correction does not influence images to be displayed.

In the above example, correction is made only by one clock period of the 27-MHz clock signal in one horizontal period. In practice, one-clock-period correction is insufficient. Several tens to hundreds clock periods must be corrected. If such a large number of clock periods are corrected all at once, the horizontal synchronous period in which the correction is made is displaced to destabilize the operation of the TV set. Namely, the viewer will see blurred images on the TV set. It is necessary, therefore, to make corrections without destabilizing the operation of the TV set. This is the reason why the embodiment makes a correction of one clock period in each horizontal synchronous period.

The 27-MHz counter 221 must also be corrected for the value stored in the PCR deviation register 226. To count the value in the register 226, i.e., the number of one-clock-period corrections to be made, there are the register 228, adder 241, and switch 243.

Initially, the PCR deviation register 226 and register 228 have the same value. The value in the register 228 is decremented by one when one-clock-period correction is made in a horizontal period. When corrections equal to the value stored in the PCR deviation register 226 are made, the register 228 will have 0 to terminate the corrections. The details of this correcting operation will be explained.

Whenever the deviation correction signal DCS arrives, the value in the register 228 is incremented by +1, −1, or +0 according to a determination made by the decision unit 242. If the output of the register 228 is positive (+), the decision unit 242 supplies −1 to the adder 241 until the output of the register 228 is zeroed. If the output of the register 228 is negative (−), the decision unit 242 provides +1 to the adder 241 until the output of the register 228 is zeroed. If the output of the register 228 is 0, the decision unit 242 provides 0 to the adder 241, to stop updating the value in the register 228.

The register 228 receives a load signal. Only when the load signal is turned on in response to, for example, the deviation correction signal DCS, the register 228 receives a new value. In this embodiment, the signal DCS is provided only at the time 5, and therefore, the register 228 is updated only once in one horizontal period. When the value in the register 228 reaches 0, this means that the clock difference has been eliminated, and therefore, updating the register 228 is stopped. At the same time, the decision unit 242 provides the switch 243 with a select signal to select +1 to normally increment the H-counter 200 by +1 at a time.

To correct the 27-MHz counter 221, the output of the decision unit 242 as well as the deviation correction signal DCS are supplied to the counter 221. Whenever the signal DCS is turned on, the counter 221 is forcibly incremented by any one of +0, +2, and +1 for correction. The counter 221 has the same structure as the H-counter 200.

The operation of the correction timing circuit 251 having the comparator H1 at the time 5 is as mentioned above. Next, the operations of the comparators 2311 (C1), 2312 (C2), D1, D2, E1, E2, F1, F2, G1, and G2 that receive the frame time signal FT will be explained.

These comparators are used to generate TV image signals. The comparators C1 and C2 are incorporated in the sync level generator 231, which generates a horizontal synchronous signal level (zero in this embodiment) between time 40 detected by the comparator C1 and time 167 detected by the comparator C2 in this embodiment. The operation of the sync level generator 231 will be explained.

The comparator C1 detects the frame time signal FT. If the signal FT indicates 40, the comparator C1 provides the RS flip-flop 2313 with a set signal to set the same. The output of the RS flip-flop 2313 and a fixed sync level of 0 are supplied as output signals of the sync level generator 231 to the switch 236. The output of the RS flip-flop 2313 serves as an enable signal for the sync level of 0 to the switch 236.

While the enable signal is being ON, the switch 236 provides the sync level. When the output of the comparator C2 becomes ON, the RS flip-flop 2313 is reset, and the sync level from the switch 236 is disabled.

The front porch generator 232, pre-color-burst signal generator 234, and post-color-burst signal generator 235 operate similar to the sync signal generator 231, and therefore, the explanations thereof are omitted. Only the color burst signal generator 233 will be explained because its operation is special.

A color burst signal is used to specify the phase of a color signal in TV signals. Accordingly, the color burst signal is connected to a television receiver. In the television receiver, a PLL circuit generates a burst signal in synchronization with the color burst signal and reproduces the color signal according to the burst signal.

The color burst signal is usually generated by a crystal oscillator, and therefore, is very stable and shows no sudden change. Accordingly, the PLL circuit in the television receiver has usually a very slow responsivity. This means that the PLL circuit in the television receiver oscillates quite stably but is unable to cope with a sudden change in the color burst signal. Accordingly, if one clock period is added or removed in each horizontal synchronization period, the PLL circuit in the television receiver is unable to respond to the change, to show color shifts on the television set. Accordingly, at least the color burst signal must be stable and must not drift even if the horizontal synchronous signal and MPEG video signal drift. A device for stabilizing the color burst signal will be explained in detail.

Figure 11A:
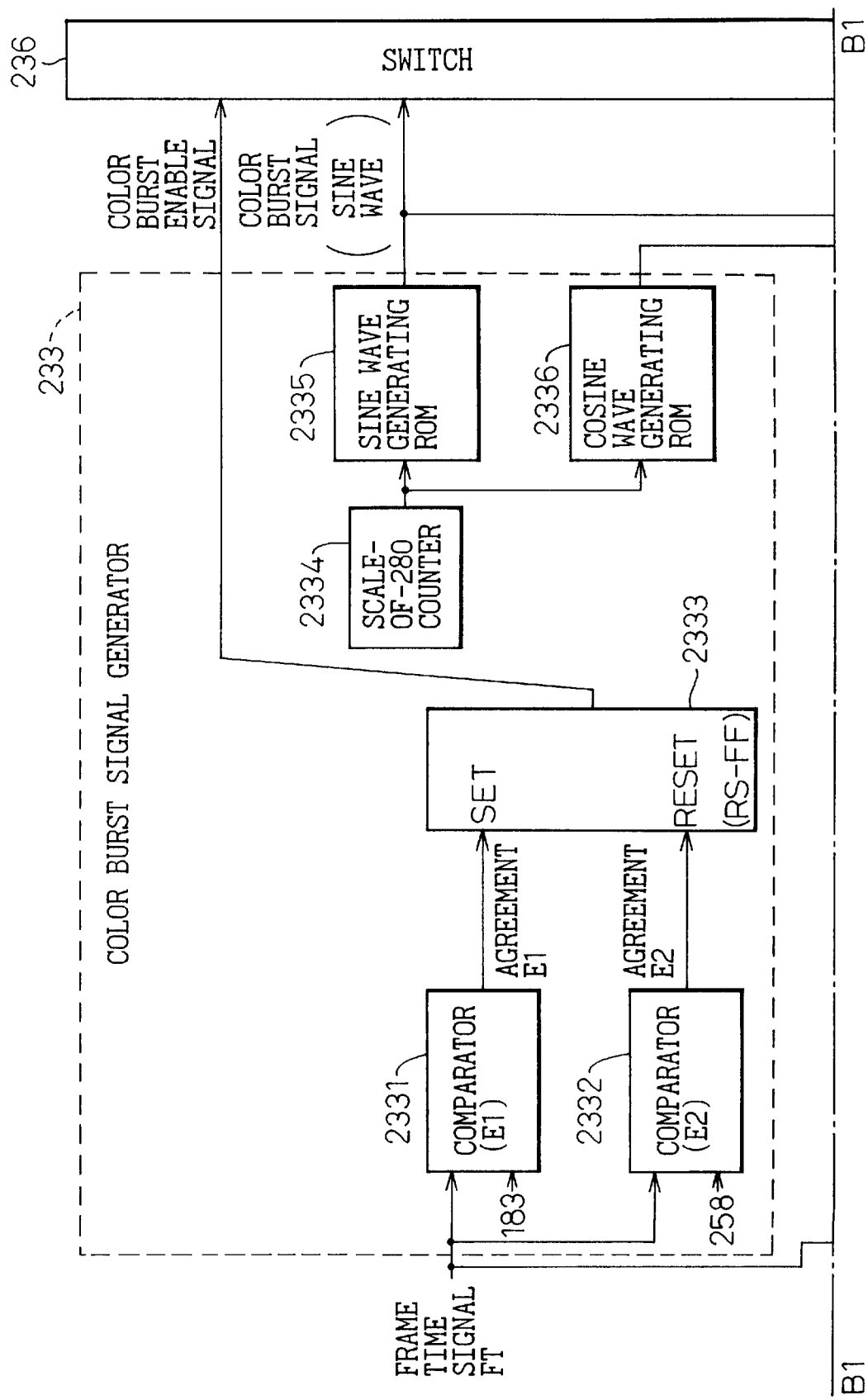
FIGS. 11A and 11B are block diagrams showing a color burst signal generator and an MPEG video output circuit both incorporated in the digital PLL circuit of FIGS. 9A to 9D.
Figure 11B:
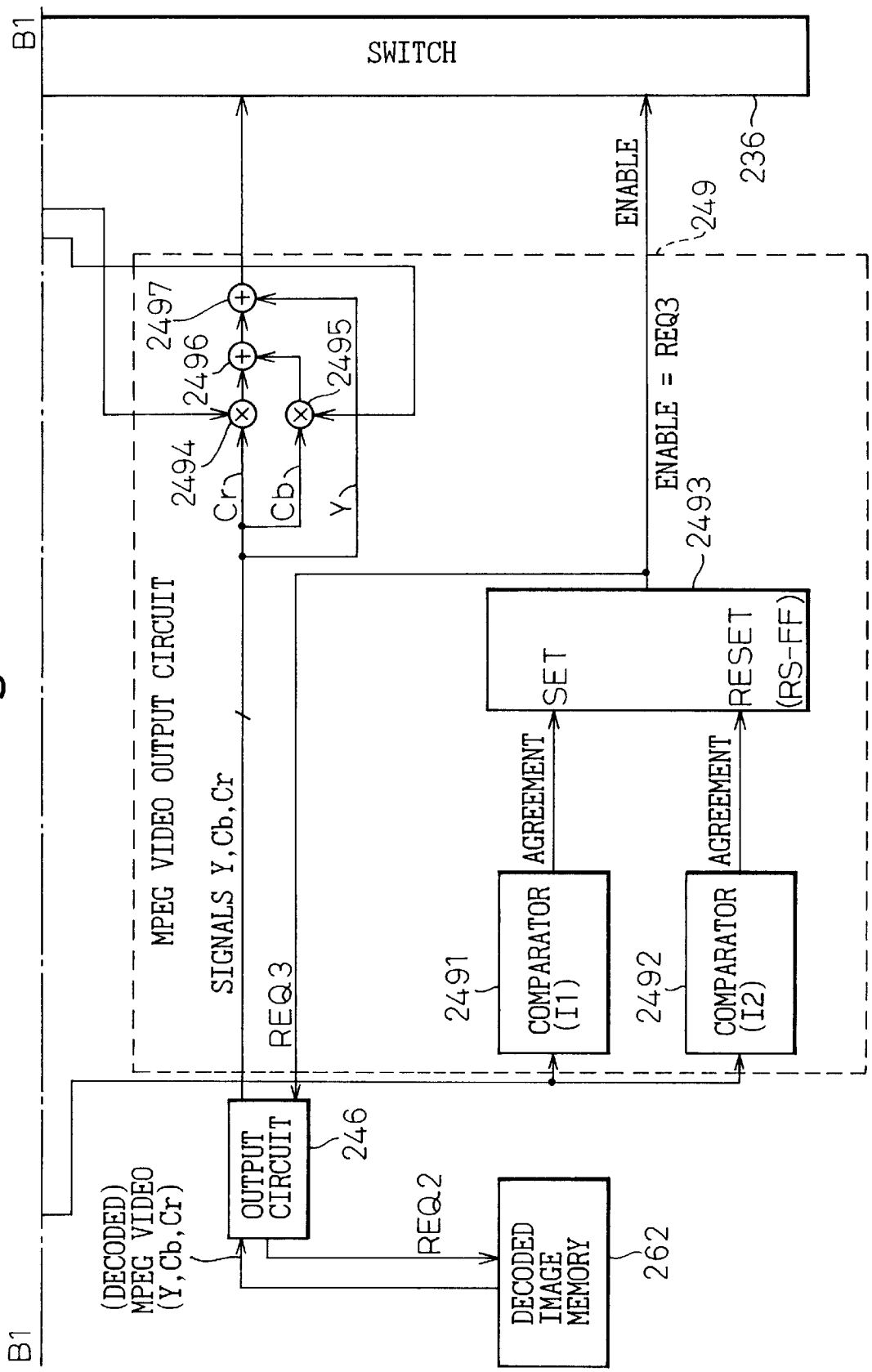
Figure 12A:
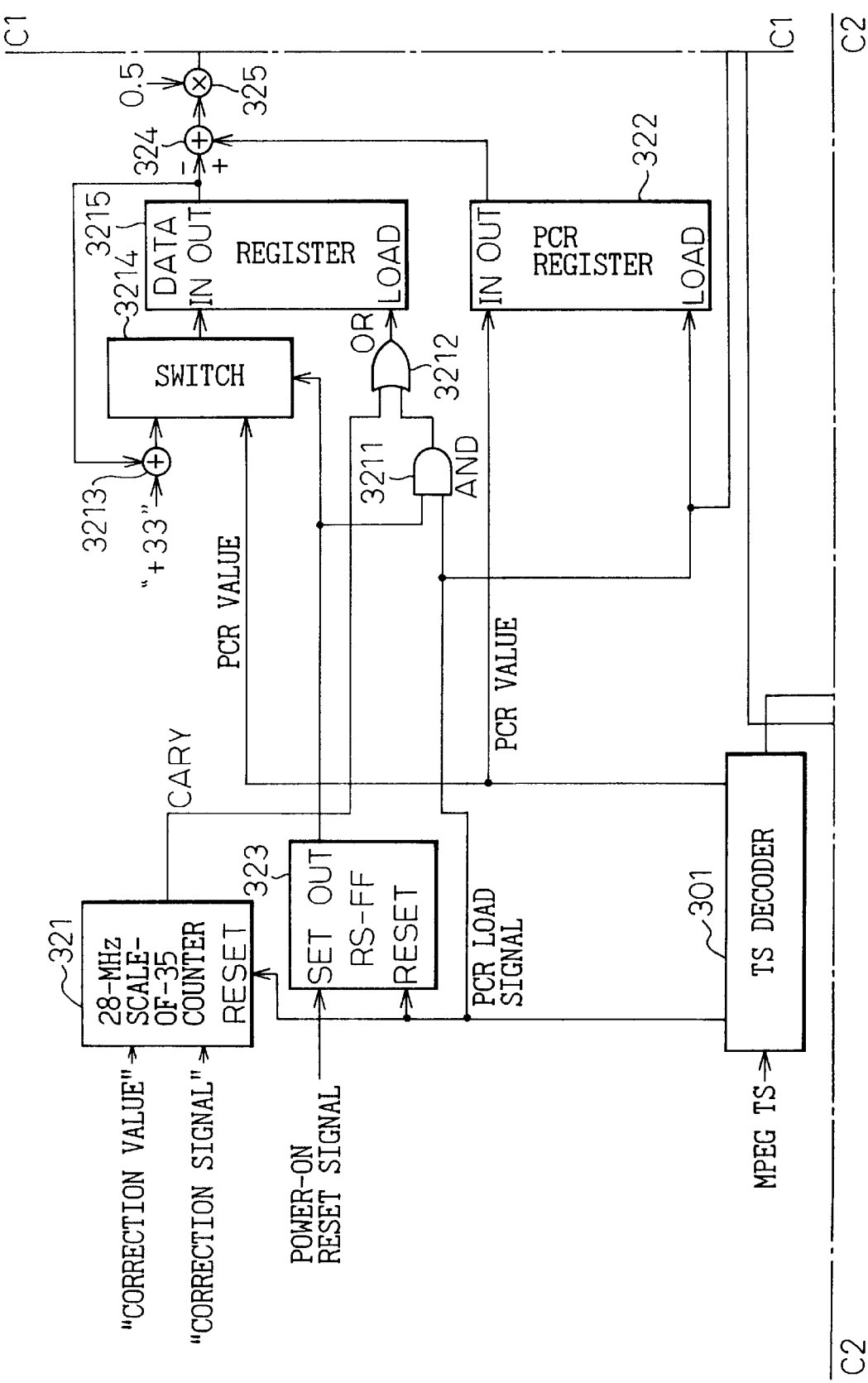
Figure 12B:
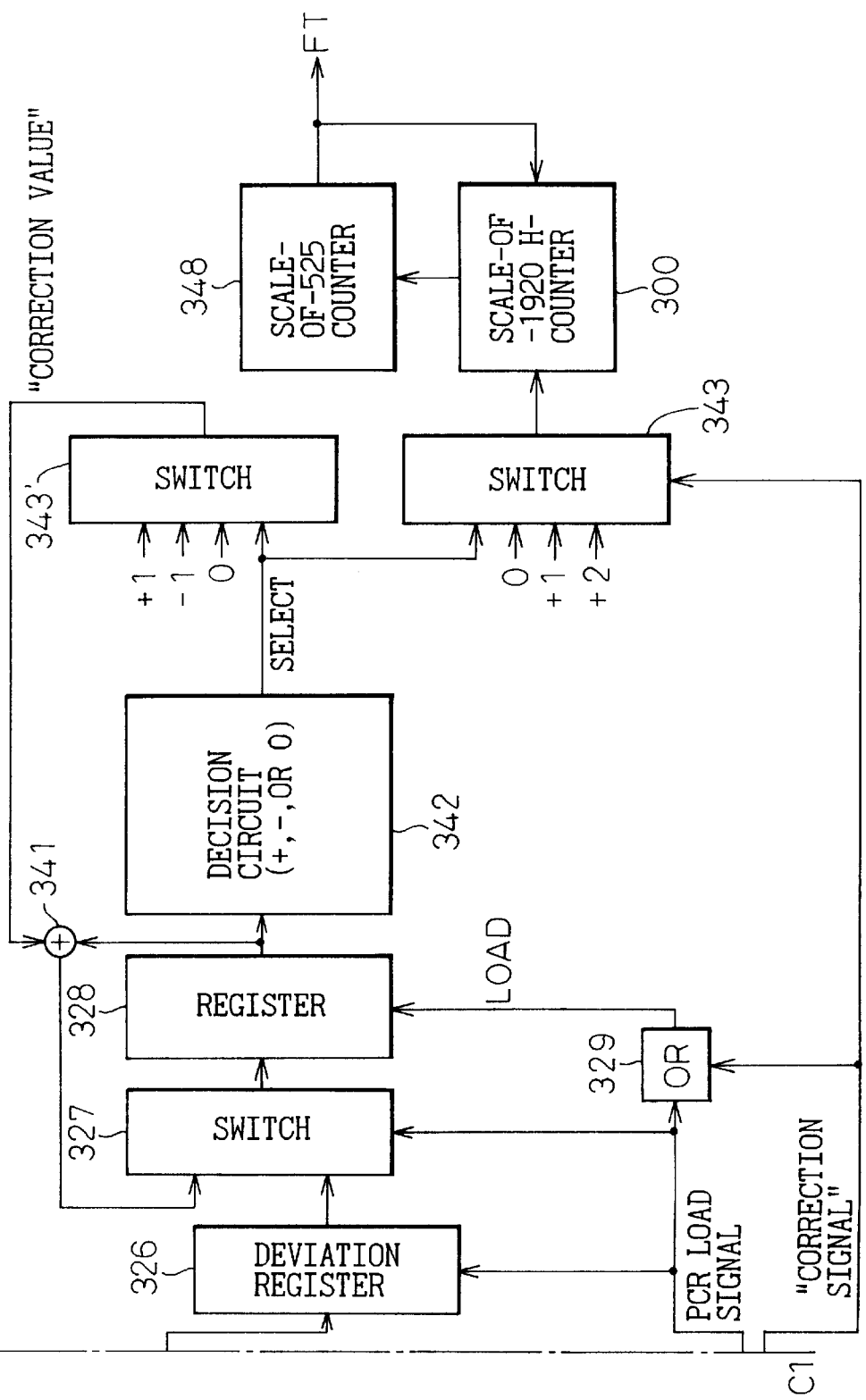
Figure 12D:
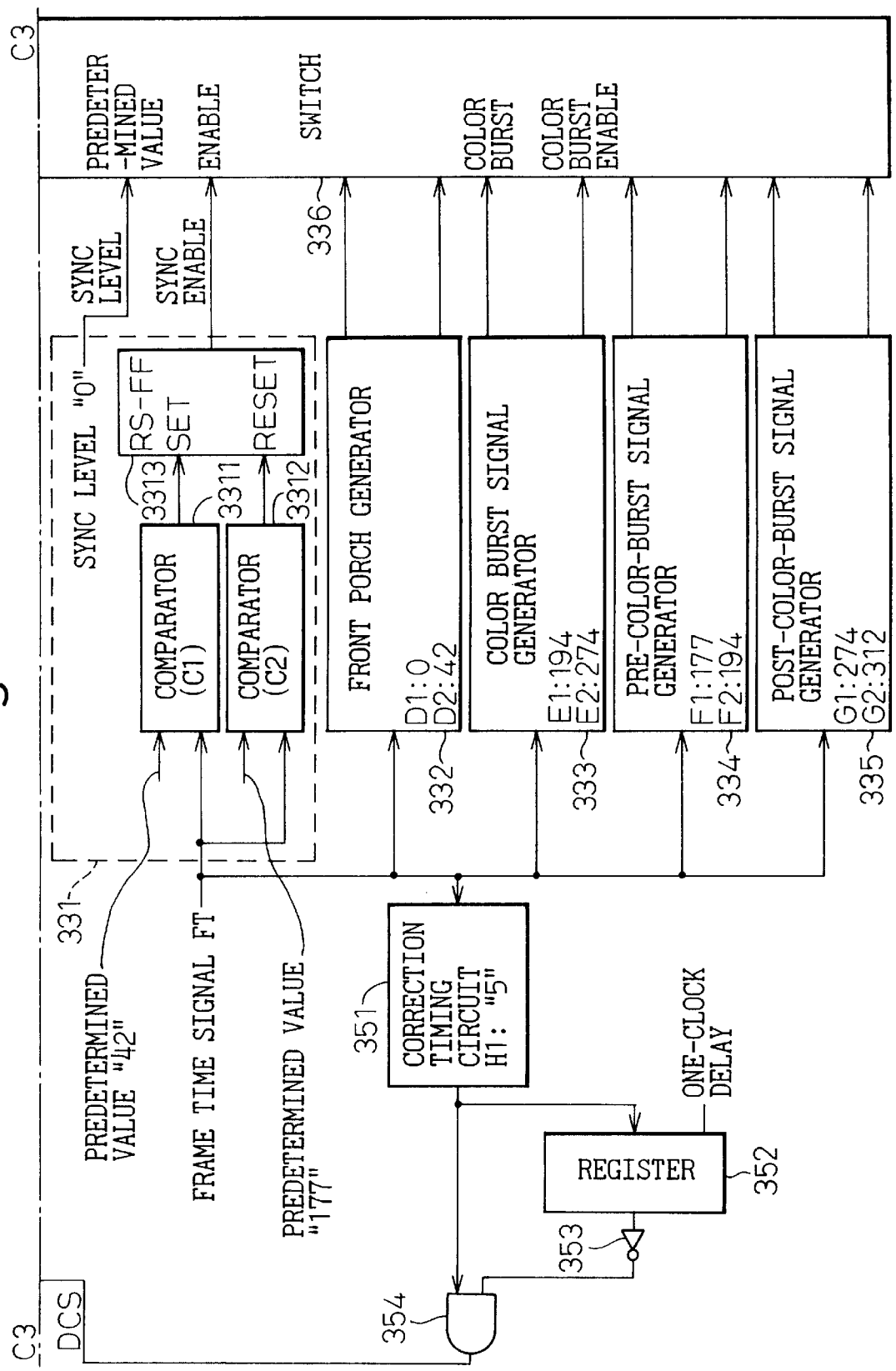

FIGS. 11A and 11B are block diagrams showing the details of the color burst signal generator 233 and MPEG video output circuit 249 of the digital PLL circuit of FIGS. 9A to 9D.

The color burst signal generator 233 has the comparator 2331 (E1), the comparator 2332 (E2), an RS flip-flop 2333, a scale-of-280 counter 2334, a sine wave generating ROM 2335, and a cosine wave generating ROM 2336. The color burst signal is basically generated by the counter 2334 that operates on the 27-MHz clock signal.

The scale-of-280 counter 2334 counts clock periods (clock pulses) to synchronize the color burst signal of about 3.58 MHz with the 27-MHz clock signal. It basically counts the least common multiple of 27 MHz and 3.58 MHz. The output of the counter 2334 is supplied to the ROMs 2335 and 2336 to provide a sine wave (the color burst signal) and a cosine wave each of 3.58 MHz. Since the color burst signal generator 233 operates on the 3.58 MHz clock signal independently of the other signals, the frequency of the color burst signal (the sine wave) provided by the color burst signal generator 233 never changes even if the other signals such as the horizontal synchronous signal drifts.

Whether or not the switch 236 passes the color burst signal, i.e., the output of the sine wave generating ROM 2335 is determined by a color burst enable signal, i.e., the output of the RS flip-flop 2333. The ON/OFF timing of the color burst enable signal is dependent on the timing of the H-counter 200 and is subjected to an increment or decrement of one clock period. With these arrangements, the frequency of the color burst signal is stable even if the frequencies of the other signals such as the horizontal synchronous signal change.

In FIG. 10, the line A+1 is shifted from the line A, to correct a deviation of one clock period of the horizontal synchronous signal. This correction is made on the H-counter 200. Usually, the H-counter 200 counts 1, 2, 3, 4, 5, 6, 7, and the like with an increment of +1 at a time. When the switch 243 provides the H-counter 200 with an increment of +2 at the time 5, the H-counter 200 counts 1, 2, 3, 4, 5, 7, 8, 9, and the like, to carryout a one-clock-period correction.

Namely, the H-counter 200 suddenly counts 7 after 5 so that the following signals are provided for the line A+1 earlier than for the line A by +1 clock period. In the line A, the horizontal synchronous signal falls at time 40. On the other hand, in the line A+1, the same signal falls one clock period earlier than in the line A. The same occurs in video signals. Namely, MPEG video signals are provided at time 294 in the line A, and one clock period earlier in the line A+1.

Similarly, the color burst signal is provided one clock period earlier in the line A+1. However, the frequency thereof never changes. Accordingly, the phase of the color burst signal at time 183 in the line A is 0° as indicated with TT1, and the same in the line A+1 is −X° as indicated with TT2.

In FIG. 11B, the MPEG video output circuit 249 has a comparator 2491 (I1), a comparator 2492 (I2), an RS flip-flop 2493, multipliers 2494 and 2495, and adders 2496 and 2497.

An MPEG video signal is decoded into signals Y, Cb, and Cr each of eight bits. These decoded signals are stored in the decoded image memory 262 and are read out thereof in response to a data request signal REQ2 from the output circuit 246.

The memory 262 also stores MPEG I-, P-, and B-pictures, which are read out thereof at timing specified by the MPEG international standards. The output circuit 246 has a line memory for storing pixel data for one horizontal scan period. Whenever it receives an enabled request signal REQ3 from the MPEG video output circuit 249, the line memory provides a piece of pixel data composed of Y, Cb, and Cr signals.

The reason why the MPEG video output circuit 249 does not directly provide the decoded image memory 262 with the request signal REQ3 will be explained. The memory 262 is usually made of a DRAM and is included in a semiconductor integrated circuit (DRAM IC) that also contains the VBV buffer 261. Accordingly, the data request must involve arbitration control between the memory 262 and the VBV buffer 261, to slow down responsivity. To quickly respond to the request signal REQ3 from the MPEG video output circuit 249, the contents of the memory 262 for one horizontal scan period are stored in the line memory of the output circuit 246.

While the request signal REQ3 is being ON, the output circuit 246 sequentially provides the MPEG video output circuit 249 with each piece of pixel data in each clock period. In a normal MPEG-2 mode, one horizontal scan period involves 720 pixels, and therefore, signals Y, Cb, and Cr for the 720 pixels are read out of the line memory one after another. Thereafter, the horizontal synchronous signal period, etc., follows during which there is no need of providing MPEG images. During this period, the output circuit 246 provides the memory 262 with the request signal REQ2, to store new data in the line memory. These operations are repeated.

The period for providing MPEG images is called an image displaying period. In this embodiment, the data request signal REQ3 is ON during this period. The start of the ON period of the signal REQ3 is adjusted by changing the count of the H-counter 200 by plus or minus one, not to make the VBV buffer 261 full or empty of MPEG compressed data.

Whenever the decoded image memory 262 becomes empty due to the reading operation based on the request signals REQ2 and REQ3, the emptiness is notified to the video decoder core 204. Then, the video decoder core 204 provides the VBV buffer 261 with the request signal REQ1 to transfer MPEG compressed data from the VBV buffer 261 to the memory 262. In this way, the VBV buffer 261 correctly stores MPEG compressed data.

In the MPEG video output circuit 249, the signals Y, Cr, and Cb are transformed into TV signals. At this time, the signals Cr and Cb are modulated according to 3.58-MHz carriers synchronized with the color burst signal. To achieve this, the circuit 249 has the multipliers 2494 and 2495 for modulating the signals Cr and Cb according to the color burst signal.

As mentioned above, the 3.58-MHz signal is irrelevant to an adjustment on the H-counter 200, and therefore, a modulated wave of the 3.58-MHz signal is unchanged even if the data request signal REQ3 is adjusted. The signals Cr and Cb must be modulated with 3.58-MHz carriers whose phases are shifted from each other by 90 degrees. For the modulation, the embodiment employs the sine wave generating ROM 2335 as well as the cosine wave generating ROM 2336 in the color burst signal generator 233. The cosine wave generating ROM 2336 generates a 3.58-MHz waveform whose phase is shifted from the output of the sine wave generating ROM 2335 by 90 degrees. The outputs of the ROMs 2335 and 2336 are used to modulate the signals Cb and Cr in the MPEG video output circuit 249.

Although the embodiment employs the 27-MHz clock signal, this does not limit the present invention. For example, the present invention is achievable on a clock signal whose frequency is an integer multiple of the color burst frequency of 3.58 MHz. The third embodiment explained below operates on a 28-MHz clock signal.

Figure 13:
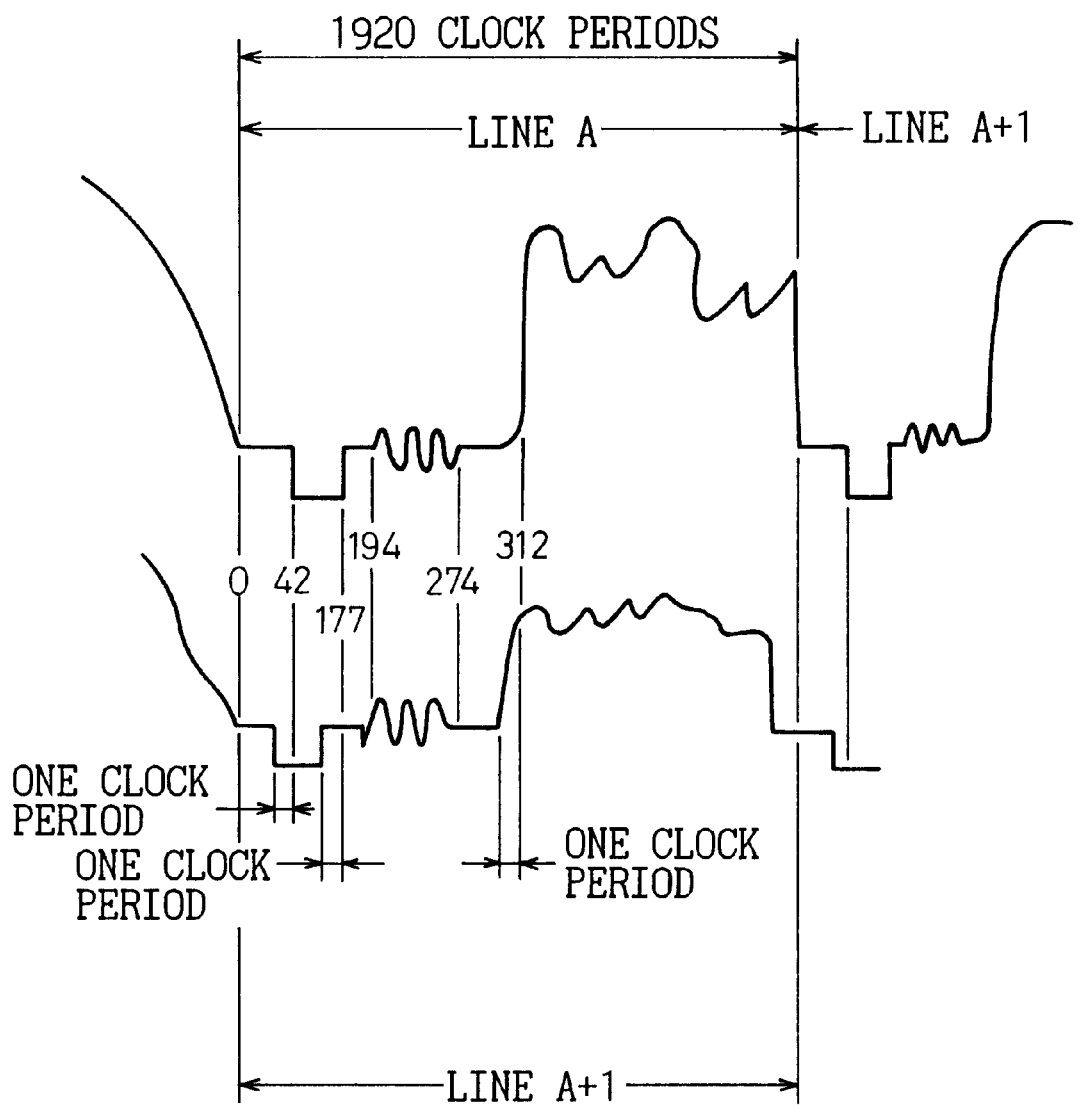
FIG. 13 is a timing chart showing the operation of the digital PLL circuit of FIGS. 12A to 12D.
Figure 14B:
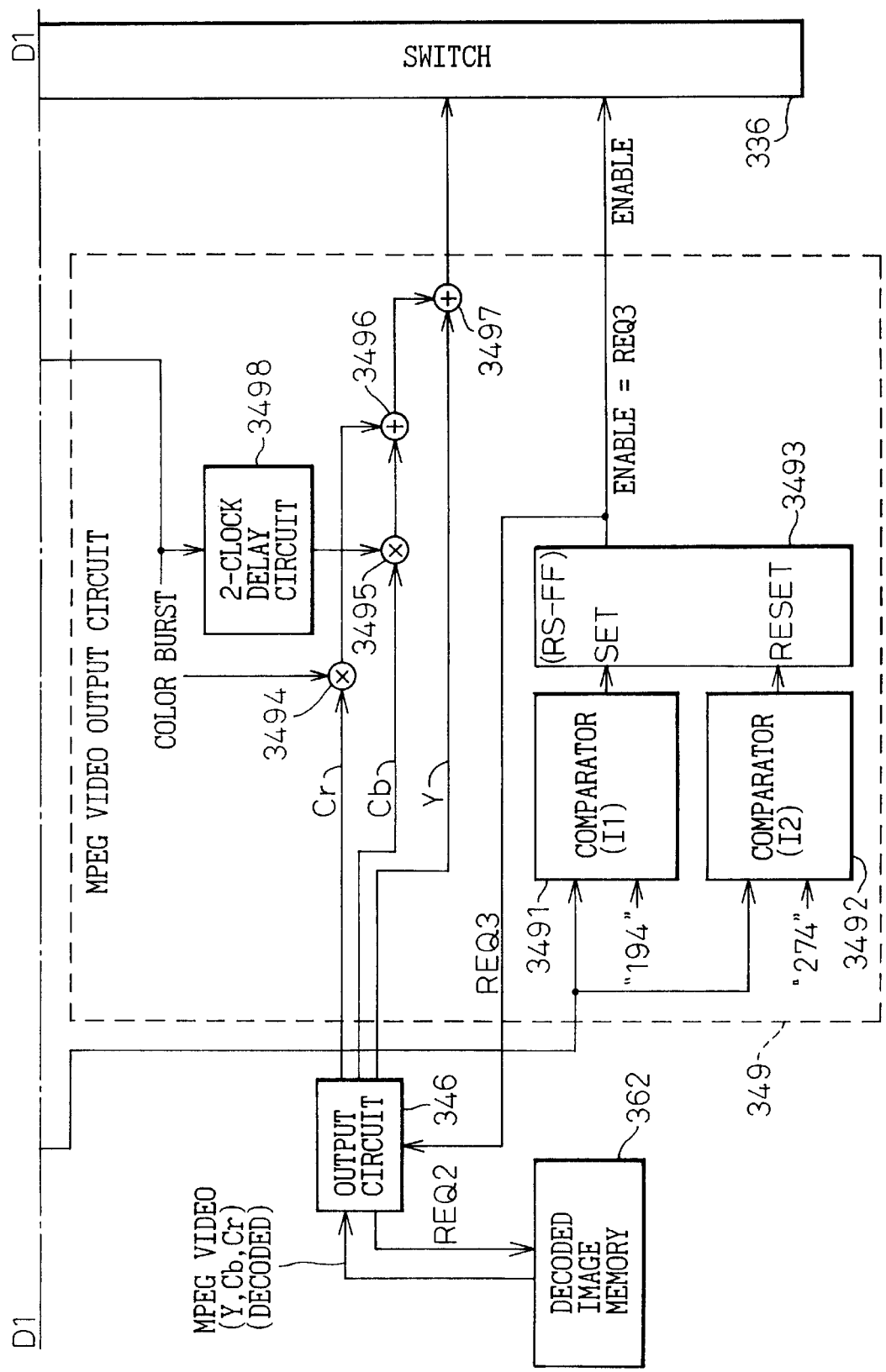

FIGS. 12A to 12D are block diagrams showing a digital PLL circuit according to the third embodiment of the present invention, FIG. 13 is a timing chart showing the operation of the digital PLL circuit, and FIGS. 14A and 14B are block diagrams showing a color burst signal generator and an MPEG video output circuit of the digital PLL circuit. Here, FIGS. 12A to 12D correspond to FIGS. 9A to 9D, FIG. 13 to FIG. 10, and FIGS. 14A and 14B to FIGS. 11A and 11B. Parts corresponding to those of FIGS. 9A to 9D, 11A, and 11B are represented with the same reference numerals plus 100 in FIGS. 12A to 12D, 14A, and 14B.

For example, a TS decoder 301, a PCR register 322, a decision unit 342, and a switch 336 of FIGS. 12A to 12D correspond to the TS decoder 201, PCR register 222, decision unit 242, and switch 236 of FIGS. 9A to 9D. Similarly, a VBV buffer 361, a video decoder core 304, a decoded image memory 362, and a correction timing circuit 351 of FIGS. 12A to 12D correspond to the VBV buffer 261, video decoder core 204, decoded image memory 262, and correction timing circuit 251 of FIGS. 9A to 9D. Further, a color burst signal generator 333, comparators 3331 and 3332, an MPEG video output circuit 349, and multipliers 3493 and 3495 of FIGS. 14A and 14B correspond to the color burst signal generator 233, comparators 2331 and 2332, MPEG video output circuit 249, and multipliers 2493 and 2495 of FIGS. 11A and 11B.

As is apparent from the comparison between FIGS. 12A to 12D and FIGS. 9A to 9D, the third embodiment employs a 28-MHz counter 321 instead of the 27-MHz counter 221 of the second embodiment. To process a carry provided by the 28-MHz counter 321 and other signals, there are arranged an AND gate 3211, an OR gate 3212, an adder 3213, a switch 3214, and a register 3215. The output of the decision unit 342 is supplied to a switch 343', which provides a predetermined deviation correction value.

The frequency of 28 MHz corresponds to 35/33 of the frequency of 27 MHz. Namely, while the 28-MHz counter 321 counts 35, the 27-MHz counter 221 counts 33. There are many techniques of artificially forming a 27-MHz counter with the use of the 28-MHz clock signal. A technique this embodiment employs will be explained.

The counter 321 of the third embodiment is a scale-of- counter operating on the 28-MHz clock signal. Whenever counting 35, the counter 321 provides a carry, which is logically processed in the AND gate 3211 and OR gate 3212, and the OR gate 3212 provides the register 3215 with a PCR load signal. The adder 3213, switch 3214, and register 3215 add 33 to the output of the register 3215, and the sum is supplied to the adder 324. When power is turned on, the output of the RS flip-flop 323 makes the switch 3214 select a PCR value so that the register 3215 may load the PCR value as it is in response to a first PCR load signal provided by the TS decoder 301. The output of the decision unit 342 is supplied to the switch 343' that selects one of deviation correction values +1, −1, and 0. The output of the switch 343' is added to the output of the register 328 by the adder 341, and the sum is supplied to the switch 327.

The other arrangements of the third embodiment are basically the same as those of the second embodiment, and therefore, their explanations are omitted. Since the third embodiment generally operates on the 28-MHz clock signal, counted values in the respective counters and reference values used by the comparators are different from those of the second embodiment. For example, the H-counter 200 of the second embodiment is a scale-of-1716 counter, while an H-counter 300 of the third embodiment is a scale-of-1920 counter. Further, the comparators 2311 and 2312 of the sync level generator 231 of the second embodiment employ reference values 40 and 167, while comparators 3311 and 3312 of the sync level generator 331 of the third embodiment employ reference values 42 and 177. The timing of providing a sync level of the third embodiment is also different from that of the second embodiment due to the clock signal difference.

The timing chart of FIG. 13 is similar to that of FIG. 10. However, each clock count of FIG. 13 is 35/33 times that of FIG. 10 due to the 28-MHz clock signal.

The color burst signal generator 333 and MPEG video output circuit 349 of FIGS. 14A and 14B are simpler than those of the second embodiment because the frequency of 28 MHz is an integer multiple of a color carrier of TV signals. Namely, the least common multiple of 28 MHz and 3.58 MHz is 8, and therefore, a counter 3334 of the color burst signal generator 333 is octal, and a sine wave generating ROM 3335 stores 8 pieces of data. When the MPEG video output circuit 349 employs a 90-degree-shifted signal for a color burst signal, arranging a clock delay circuit 3498 that delays the color burst signal by two clock periods is sufficient to generate the 90-degree-shifted signal. Namely, unlike the second embodiment that arranges the cosine wave generating ROM 2336 in the color burst signal generator 233, the third embodiment employs the clock delay circuit 3498 to delay the output of the sine wave generating ROM 3335 by two clock periods and provide the delayed signal to a multiplier 3495. In FIG. 14B, the clock delay circuit 3498 is included in the MPEG video output circuit 349.

Each pixel read out of the MPEG video output circuit 349 is based on the 27-MHz clock signal, and therefore, an image will be contracted by 33/35 if the pixels are displayed as they are. To avoid this, a 28-MHz clock converter is inserted. This converter is realized with various techniques. For example, a scale-of-35 counter is arranged to provide a preceding pixel upon counting 2 or 17, thereby increasing 33 pixels to 35 to avoid the contraction of images.

Although the second and third embodiments make a correction of +1 or −1 clock period at a time, any correction value is employable according to the present invention. Changing the correction value is realized by changing the values 0, +1, and +2 supplied to the switch 243 and the values +1, 0, and −1 supplied to the adder 241 in the case of the second embodiment.

In the second embodiment, the comparators 2311 (C1) and 2312 (C2) of the sync level generator 231 handle only horizontal clock periods. They may handle vertical clock periods, too. Although the second embodiment repeats the same operations in every line, different operations may be carried out in different lines. This is realized by expanding the comparison ranges of the comparators so that given operations may be carried out in given lines. It is also possible to correct a deviation all at once in a vertical blanking period.

As explained above, the present invention forms a digital PLL circuit with an oscillator such as a crystal oscillator that oscillates at a fixed frequency instead of a VCO, thereby reducing the costs of external parts to be arranged for the PLL circuit. The digital PLL circuit of the present invention is a completely digital processor that can be integrated into an LSI chip.

The digital PLL circuit of the present invention is inexpensive because it employs no DA converter nor VCO.

Many different embodiments of the present invention may be constructed without departing from the spirit and scope of the present invention, and it should be understood that the present invention is not limited to the specific embodiments described in this specification, except as defined in the appended claims.

What is claimed is:

1. A digital PLL circuit, applied to an MPEG decoder, that employs a fixed-frequency output signal from a fixed-frequency oscillator to provide a signal synchronized with an external program clock reference signal in an MPEG stream, the output signal of said digital PLL circuit being used as a clock signal for synchronizing a stream receiver of said MPEG decoder with the program clock reference signal, comprising:

a counting unit counting clock periods of the fixed-frequency output signal and producing a corresponding count value; and an adjusting unit incrementing or decrementing the count value, produced by said counting unit, a predetermined number of times in a predetermined period according to a deviation of the fixed-frequency output signal from the program clock reference signal.

2. A digital PLL circuit as claimed in claim 1, wherein said counting unit counts clock periods of a signal whose frequency is n times the frequency of the fixed-frequency output signal, where n is a positive integer.

3. A digital PLL circuit as claimed in claim 1, wherein said digital PLL circuit is used to decode and reproduce MPEG audio information.

4. A digital PLL circuit as claimed in claim 1, wherein said digital PLL circuit is used to decode and reproduce MPEG video information.

5. A digital PLL circuit as claimed in claim 4, wherein said digital PLL circuit adjusts a phase of a predetermined signal when converting the decoded MPEG video information into television signals.

6. A digital PLL circuit as claimed in claim 5, wherein the decoded MPEG video information is digitally converted into television signals by an NTSC encoder according to the program clock reference signal or a clock signal synchronized with the reference signal, and said digital PLL circuit reversely adjusts, according to phase information, a phase of a color sub-carrier used by said NTSC encoder when carrying out a conversion, the phase information being for correcting a hue error caused by an adjustment made by said adjusting unit.

7. A digital PLL circuit as claimed in claim 4, wherein said digital PLL circuit corrects a value counted by a counter that controls an overall timing of an output circuit operating on the program clock reference signal, thereby synchronizing said counter with the reference signal.

8. A digital PLL circuit as claimed in claim 7, wherein the count value, produced by said counter, that controls the overall timing of said output circuit operating on the program clock reference signal is incremented or decremented once or a plurality of times by a predetermined value in a predetermined period, so as to change the overall timing of said output circuit and synchronize the same with the reference signal.

9. A digital PLL circuit as claimed in claim 8, wherein the predetermined value and the number of increments or decrements in the predetermined period are adjustable.

10. A digital PLL circuit as claimed in claim 7, wherein an increment or a decrement in the count value produced by said counter is carried out in one or a plurality of time bands in a blanking period after image information is displayed and before the next synchronous signal arrives.

11. A digital PLL circuit as claimed in claim 7, wherein an increment or a decrement in the count value produced by said counter is carried out in a plurality of time bands distributed over fields, frames, horizontal scan periods, or a combination thereof.

12. An MPEG decoder having a memory unit temporarily storing an MPEG stream and a digital PLL circuit employing a fixed-frequency output signal from a fixed-frequency oscillator to provide a signal synchronized with an external program clock reference signal in an MPEG stream, the output signal of said digital PLL circuit being used as a clock signal for synchronizing a stream receiver of said MPEG decoder with the program clock reference signal, wherein said digital PLL circuit comprises:

a counting unit counting clock periods of the fixed-frequency output signal and producing a corresponding count value; and an adjusting unit incrementing or decrementing the count value, produced by said counting unit, a predetermined number of times in a predetermined period according to a deviation of the fixed-frequency output signal from the program clock reference signal.

13. An MPEG decoder as claimed in claim 12, wherein said counting unit counts clock periods of a signal whose frequency is n times the frequency of the fixed-frequency output signal, where n is a positive integer.

14. An MPEG decoder as claimed in claim 12, wherein said digital PLL circuit is used to decode and reproduce MPEG audio information.

15. An MPEG decoder as claimed in claim 12, wherein said digital PLL circuit is used to decode and reproduce MPEG video information.

16. An MPEG decoder as claimed in claim 15, wherein said digital PLL circuit adjusts a phase of a predetermined signal when converting the decoded MPEG video information into television signals.

17. An MPEG decoder as claimed in claim 16, wherein the decoded MPEG video information is digitally converted into television signals by an NTSC encoder according to the program clock reference signal or a clock signal synchronized with the reference signal, and said digital PLL circuit reversely adjusts, according to phase information, a phase of a color sub-carrier used by said NTSC encoder when carrying out a conversion, the phase information being for correcting a hue error caused by an adjustment made by said adjusting unit.

18. An MPEG decoder as claimed in claim 15, wherein said digital PLL circuit corrects a value counted by a counter that controls an overall timing of an output circuit operating on the program clock reference signal, thereby synchronizing said counter with the reference signal.

19. An MPEG decoder as claimed in claim 18, wherein the count value, produced by said counter, that controls the overall timing of said output circuit operating on the program clock reference signal is incremented or decremented once or a plurality of times by a predetermined value in a predetermined period, so as to change the overall timing of said output circuit and synchronize the same with the reference signal.

20. An MPEG decoder as claimed in claim 19, wherein the predetermined value and the number of increments or decrements in the predetermined period are adjustable.

21. An MPEG decoder as claimed in claim 18, wherein an increment or a decrement in the count value produced by said counter is carried out in one or a plurality of time bands in a blanking period after image information is displayed and before the next synchronous signal arrives.

22. An MPEG decoder as claimed in claim 18, wherein an increment or a decrement in the count value produced by said counter is carried out in a plurality of time bands distributed over fields, frames, horizontal scan periods, or a combination thereof.

23. A digital PLL circuit for use in association with an MPEG decoder to which is applied an MPEG stream having an external program clock reference signal, comprising:

a counting unit receiving a fixed frequency signal from a fixed-frequency oscillator and counting clock periods of the fixed-frequency signal to accumulate a first count value representing the frequency of the fixed-frequency signal; and an adjusting unit comparing a second count value, representing the frequency of the external program clock reference signal, with the first count value, counted by the counting unit, and determining if a difference count value exists therebetween, and incrementing or decrementing the count value counted by the counting unit in accordance with any difference count value and producing a corresponding output signal used as a third clock signal for synchronizing an MPEG stream receiver of the MPEG decoder.

24. A digital PLL circuit as claimed in claim 23, wherein said counting unit counts clock periods of a signal whose frequency is n times the frequency of the fixed-frequency output signal, where n is a positive integer.

25. A digital PLL circuit as claimed in claim 23, wherein said digital PLL circuit is used to decode and reproduce MPEG audio information.

26. A digital PLL circuit as claimed in claim 23, wherein said digital PLL circuit is used to decode and reproduce MPEG video information.

27. A digital PLL circuit as claimed in claim 26, wherein said digital PLL circuit adjusts a phase of a predetermined signal when converting the decoded MPEG video information into television signals.

28. A digital PLL circuit as claimed in claim 27, wherein the decoded MPEG video information is digitally converted into television signals by an NTSC encoder according to the program clock reference signal or a clock signal synchronized with the reference signal, and said digital PLL circuit reversely adjusts, according to phase information, a phase of a color sub-carrier used by said NTSC encoder when carrying out a conversion, the phase information being for correcting a hue error caused by an adjustment made by said adjusting unit.

29. A digital PLL circuit as claimed in claim 26, wherein said digital PLL circuit corrects a value counted by a counter that controls an overall timing of an output circuit operating on the program clock reference signal, thereby synchronizing said counter with the reference signal.

30. A digital PLL circuit as claimed in claim 29, wherein the count value, produced by said counter, that controls the overall timing of said output circuit operating on the program clock reference signal is incremented or decremented once or a plurality of times by a predetermined value in a predetermined period, so as to change the overall timing of said output circuit and synchronize the same with the reference signal.

31. A digital PLL circuit as claimed in claim 30, wherein the predetermined value and the number of increments or decrements in the predetermined period are adjustable.

32. A digital PLL circuit as claimed in claim 31, wherein an increment or a decrement in the count value produced by said counter is carried out in one or a plurality of time bands in a blanking period after image information is displayed and before the next synchronous signal arrives.

33. A digital PLL circuit as claimed in claim 29, wherein an increment or a decrement in the count value produced by said counter is carried out in a plurality of time bands distributed over fields, frames, horizontal scan periods, or a combination thereof.

34. A digital PLL circuit, applied to a decoder, that employs a fixed-frequency output signal from a fixed-frequency oscillator to provide a signal synchronized with an external program clock reference signal in an data stream, the output signal of said digital PLL circuit being used as a clock signal for synchronizing a stream receiver of said decoder with the program clock reference signal, comprising:

counting unit counting clock periods of the fixed-frequency output signal and producing a corresponding count value; and an adjusting unit incrementing or decrementing the count value, produced by said counting unit, a predetermined number of times in a predetermined period according to a deviation of the fixed-frequency output signal from the program clock reference signal.

35. An decoder having a memory unit temporarily storing a data stream and a digital PLL circuit employing a fixed-frequency output signal from a fixed-frequency oscillator to provide a signal synchronized with an external program clock reference signal in a data stream, the output signal of said digital PLL circuit being used as a clock signal for synchronizing a stream receiver of said decoder with the program clock reference signal, wherein said digital PLL circuit comprises:

a counting unit counting clock periods of the fixed-frequency output signal and producing a corresponding count value; and an adjusting unit incrementing or decrementing the count value, produced by said counting unit, a predetermined number of times in a predetermined period according to a deviation of the fixed-frequency output signal from the program clock reference signal.

36. A digital PLL circuit for use in association with a decoder to which is applied a data stream having an external program clock reference signal, comprising:

a counting unit receiving a fixed-frequency signal from a fixed-frequency oscillator and counting clock periods of the fixed-frequency signal to accumulate a first count value representing the frequency of the fixed-frequency signal; and an adjusting unit comparing a second count value, representing the frequency of the external program clock reference signal; with the first count value, counted by the counting unit, and determining if a difference count value exists therebetween, and incrementing or decrementing the count value counted by the counting unit in accordance with any difference count value and producing a corresponding output signal used as a third clock signal for synchronizing a data stream receiver of the decoder.

* * * * *

UNITED STATES PATENT AND TRADEMARK OFFICE
CERTIFICATE OF CORRECTION

PATENT NO. : 6,175,385 B1
DATED : January 16, 2001
INVENTOR(S) : Kiyoshi Kohiyama et al.

Page 1 of 1

It is certified that error appears in the above-identified patent and that said Letters Patent is hereby corrected as shown below:

Column 23,
Line 1, before "counting " (first occurrence) insert -- a --.

Signed and Sealed this

Twenty-fifth Day of September, 2001

Attest:

*Nicholas P. Godici*

NICHOLAS P. GODICI
*Attesting Officer*   *Acting Director of the United States Patent and Trademark Office*